(12) United States Patent
Fujisawa et al.

(10) Patent No.: US 6,775,185 B2
(45) Date of Patent: Aug. 10, 2004

(54) NONVOLATILE SEMICONDUCTOR MEMORY

(75) Inventors: Tomoyuki Fujisawa, Kodaira (JP);
Keiichi Yoshida, Musashimurayama (JP); Yoshinori Takase, Tokyo (JP);
Takashi Horii, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/404,085

(22) Filed: Apr. 2, 2003

(65) Prior Publication Data

US 2003/0198084 A1 Oct. 23, 2003

(30) Foreign Application Priority Data

Apr. 18, 2002 (JP) .................................. 2002-115923

(51) Int. Cl.⁷ .............................. G11C 16/04; G11C 8/00
(52) U.S. Cl. .............................. 365/185.11; 365/185.01; 365/250.3
(58) Field of Search ....................... 365/185.11, 185.01, 365/230.03, 189.01, 189.04

(56) References Cited

U.S. PATENT DOCUMENTS

| | | | | |
|---|---|---|---|---|
| 5,982,664 A | * | 11/1999 | Watanabe | 365/185.11 |
| 6,240,040 B1 | * | 5/2001 | Akaogi et al. | 365/230.06 |
| 6,438,028 B1 | | 8/2002 | Kobayashi et al. | 365/185 |
| 6,580,637 B2 | * | 6/2003 | Pascucci | 365/185.11 |
| 6,687,181 B2 | * | 2/2004 | Usuki et al. | 365/230.03 |
| 2002/0114192 A1 | | 8/2002 | Takase et al. | 365/185.28 |

FOREIGN PATENT DOCUMENTS

| | | |
|---|---|---|
| JP | 11-85609 | 3/1999 |
| JP | 2001-28428 | 1/2001 |
| JP | 2002-197876 | 7/2002 |

* cited by examiner

*Primary Examiner*—Anh Phung
(74) *Attorney, Agent, or Firm*—Miles & Stockbridge P.C.

(57) ABSTRACT

A memory bank comprises nonvolatile memory sections and two buffer sections to respectively store information of access unit of the nonvolatile memory sections. In response to the instruction of access operation, the memory bank performs data transfer between one buffer section of the memory bank and the nonvolatile memory section. In parallel to this data transfer, the memory bank also enables control of interleave operation to perform data transfer between the other buffer section of the relevant memory bank and the external side. Accordingly, high speed access can be realized by conducting in parallel the data transfer between the nonvolatile memory section and the buffer section and data transfer between the buffer section and the external side in the interleave operation. Moreover, high speed write and read access to the nonvolatile memory section can also be realized.

10 Claims, 21 Drawing Sheets

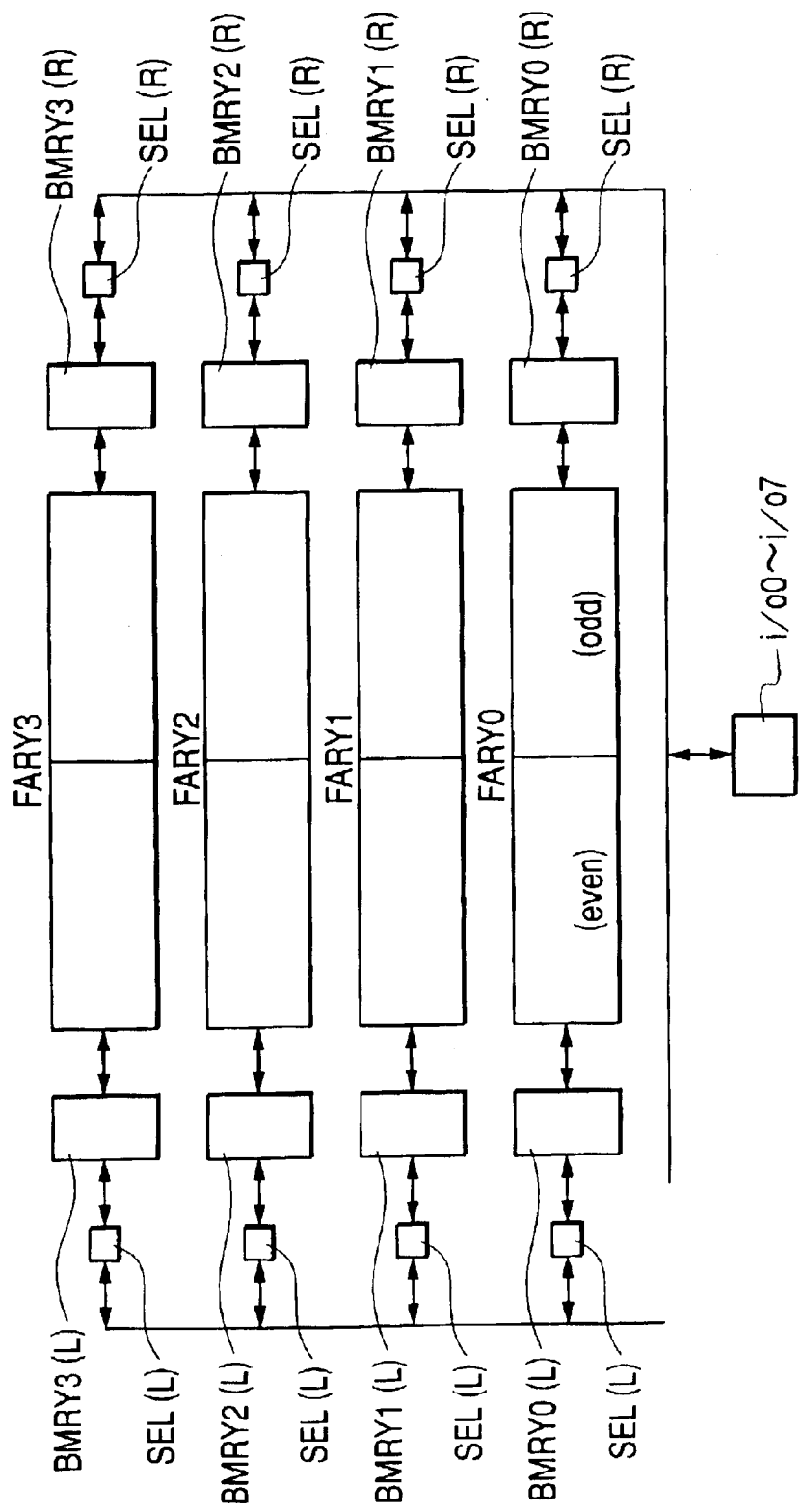

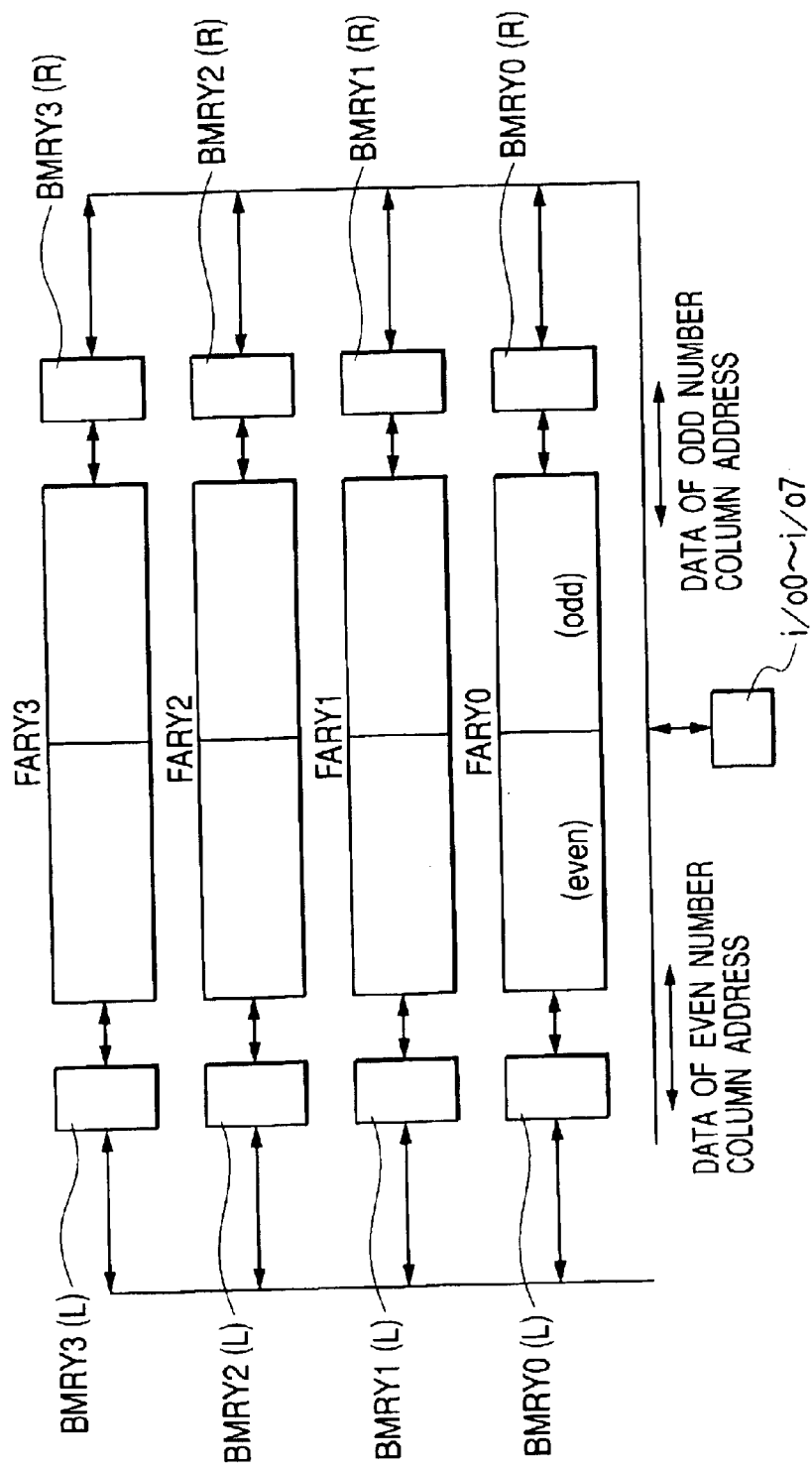

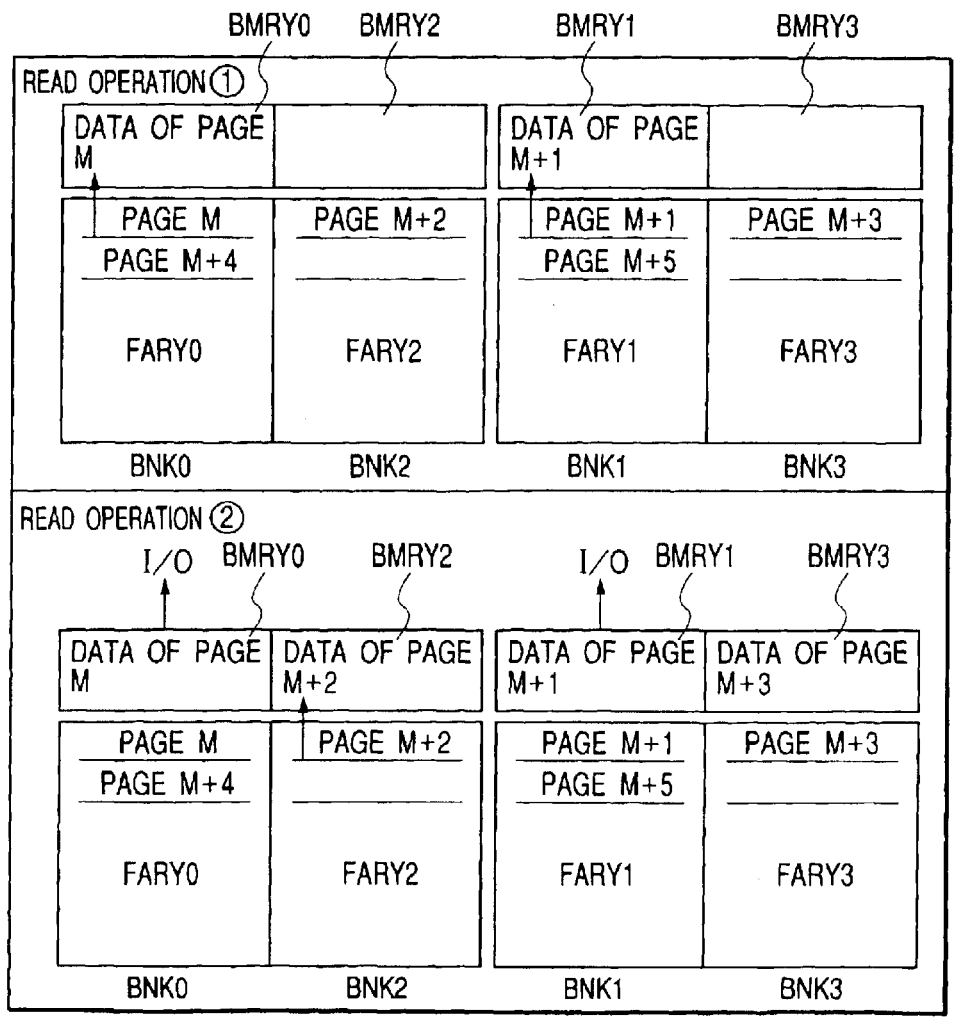

NONVOLATILE SEMICONDUCTOR MEMORY

BACKGROUND OF THE INVENTION

The present invention relates to a semiconductor memory including a nonvolatile memory section and a buffer section thereof and particularly to a technique to realize high speed access with interleave operation by utilizing the nonvolatile memory section and the buffer section, for example, the technique which may be utilized effectively to a flash memory.

The Japanese Patent Application Publication No. Hei 11(1999)-85609 describes a flash memory including a nonvolatile memory section and a buffer section thereof. According to this flash memory, the memory section can read or write data only in the unit of 8-bit or 16-bit and the buffer section provided is tacitly used to execute commands of erase, write and read operations for the flash memory because it is required to perform exchange of data in unit of single sector or a plurality of sectors such as 512 bytes in a host device.

Moreover, the Japanese Patent Application Publication Nos. 2001-28428 (U.S. Pat. No. 6,438,028) and 2002-197876 (U.S. Publication No. US-2002-0114192-A1) describe a flash memory utilizing an assist gate (AG) for separation of elements thereof. When the assist gate (AG) is used for separation of elements in the flash memory, a source and a drain can be used in common. In this case, since the source and drain locations are replaced with each other as required for the write and read operations, it is required to set the memory cells in every other cell an the operation object for many cells provided in parallel using in common the word line thereof. In short, since the adjacent memory cells use in common the source line and bit line connected to the source and drain, an operation error is generated when the adjacent memory cells are operated in parallel. Accordingly, the write and read operations to the flash memory described above using in common the word line have to be performed individually in the flash memories of the even numbers and that of the odd numbers.

SUMMARY OF THE INVENTION

The inventors of the present invention have discussed this point and found following problem. When the write and read operations are conducted continuously, information stored in the memory cells of even numbers is read to the buffer section from the memory section for the memory cells connected to only one word line, information in the buffer section is then outputted to the external side, thereafter information stored in the memory cells of the odd numbers is read to the buffer section from the memory section, and information in the buffer section is outputted to the external side. There is provided the buffer section which can store temporarily the information of one word line and operations must be separated perfectly for the memory cells of the even numbers and odd numbers. The situation is exactly the same in the case of the write operation and this situation will impede high speed access operation. This problem results not only from the reason that access is separated for the memory cells of the even numbers and odd numbers in the 4-level flash memory but also from the restriction on the selection scale of memory cells in the 2-level flash memory and storage capacity of buffer section.

An object of the present invention is to provide a semiconductor memory which can realize high speed write and read access to and from a nonvolatile memory section.

Another object of the present invention is to provide a semiconductor memory which can reduce overhead in the data transfer between the external side and the nonvolatile memory section.

The aforementioned and the other objects and novel features of the present invention will become apparent from the following description of this specification and the accompanying drawings.

Typical inventions among those disclosed in this specification will be briefly described as follows.

[1] <<Doubled Buffer Size of Access Unit>>

According to a first aspect, the semiconductor memory of the present invention includes a plurality of memory banks and control sections and each memory bank includes a plurality of nonvolatile memory sections which can update stored information and a pair of buffer sections which can respectively store the information in unit of write and read operation of the nonvolatile memory section. The control section performs, in response to an instruction for access operation, data transfer between one buffer section of the memory bank and the nonvolatile memory section and is also capable of controlling interleave operation for data transfer between the other buffer section of the relevant memory bank and the external side. The nonvolatile memory section is configured, for example, with a flash memory section.

From the above description, since the operation to transfer the data read from the nonvolatile memory section to one buffer section and the operation to output the read data transferred to the other buffer section to the external side are performed in parallel in the read operation, high speed read operation can be realized in comparison with the case where the serial operation that data read from the nonvolatile memory section is transferred to the buffer section and this data is then outputted to the external side from the relevant buffer section is sequentially performed. This process can also be applied to the write operation. In this write operation, since the operation to transfer the write data to one buffer section from the external side and the operation to transfer the write data already transferred to the other data buffer to the nonvolatile memory section are performed in parallel, high speed write operation can be realized in comparison with the case where the serial operation that the write data is transferred to the buffer section from the external side and this data is then transferred to the nonvolatile memory section is sequentially performed.

As a practical profile of the present invention, the nonvolatile memory section includes a plurality of memory cells which are allocated in a matrix, a plurality of memory cells include in common a word line in every predetermined number, and in the control section, a part of the memory cells and the remainders using in common the word line are individually considered as the objects of access operation in the write and read access operations. For example, the control section individually considers the memory cells of the even numbers and odd numbers among those using in common the word line as the objects of the write access operation and read access operation.

In this case, the control section is capable of realizing in parallel the operation, in response to an instruction of the read access operation, to control one buffer section corresponding to respective nonvolatile memory section to transfer in parallel the read data by causing the plural nonvolatile memory sections to perform in parallel the data read operation and the operation to sequentially select the other buffer sections to cause these buffer sections to output the read date stored therein to the external side. Moreover, the control section is also capable of realizing in parallel the operation, in response to an instruction of the write access operation, to sequentially select one buffer section to transfer the write data from the external side and the operation to write the data by transferring in parallel the write data to the corresponding nonvolatile memory section from the plural buffer sections.

[2] <<Buffer Size Equal to Access Unit>>

According to a second aspect, the semiconductor memory of the present invention includes a plurality of memory banks and a control section. Each memory bank includes a plurality of nonvolatile memory sections which can update stored information and a buffer section which can store information of the write unit and read unit of the nonvolatile memory section. The control section enables use of the buffer sections of the relevant memory bank and the other two memory banks for the operation of one memory bank instructed as the access object. During access to the relevant memory bank, the buffer section of the same memory bank performs the data transfer to or from the nonvolatile memory section or the external side and the buffer sections of the other memory banks can control, in parallel to such data transfer, the interleave operation for data transfer to or from the nonvolatile memory unit of the relevant memory bank or the external side.

From above description, when the read access is executed to the read data of a plurality of pages, the data transfer operation to one buffer section from the nonvolatile memory section is performed in parallel with the external output operation of data which is already transferred to the other buffer section. Moreover, when write access is executed to the write data of a plurality of pages, the data transfer operation to one buffer section from the external side is executed in parallel with the transfer operation to the nonvolatile memory section of write data which is already transferred to the other buffer section. Accordingly, high speed write and read access operations may be realized.

As the practical profile of the present invention, when amount of information in the write and read operation unit in the nonvolatile memory section is defined as a unit block in the interleave operation, it is recommended to continuously perform twice the address assignment of the unit block in the memory bank.

[3] <<Buffer Size Equal to Access Unit>>

According to a third aspect, the semiconductor memory of the present invention includes a plurality of memory banks and a control section. Each memory bank includes a plurality of nonvolatile memory sections which can update the stored information and a buffer section which can store the information in unit of write and read operation of the nonvolatile memory section. The control section performs, in response to an instruction of access operation, data transfer between the buffer section of a memory bank and the nonvolatile memory section and enables, in parallel with this data transfer, control of the interleave operation for data transfer between the buffer section of the other memory bank and the external side.

From above description, when the read access is made to the read data of a plurality of pages, the data transfer operation to one buffer section from the nonvolatile memory unit is executed in parallel with the external output operation of data which is already transferred to the other buffer section. Moreover, when the write access is made to the write data of a plurality of pages, the data transfer operation to one buffer section from the external side is executed in parallel with the transfer operation to the nonvolatile memory section of the write data which is already transferred to the other buffer section. Accordingly, high speed write and read access operations can be realized.

As a practical profile of the present invention, when amount of information in the write and read operation unit in the nonvolatile memory section is defined as a unit block in the interleave operation, it is recommended to non-continuously execute the address assignment of the unit block within the memory bank.

BRIEF DESCRIPTION OF THE DRAWINGS

FIG. 16 is a schematic diagram illustrating connections among the flash memory array, buffer memory and input/output terminals in the structure where the buffer memory size of memory bank is two times the access unit.

FIG. 17 is a schematic diagram illustrating connections among the flash memory array, buffer memory and input/output terminals in the structure where the buffer memory size of memory bank is equal to the access unit.

FIG. 18 illustrates an example of mapping of page address for the memory bank for interleave access in the memory array structure having a buffer memory equal to the access unit for every bank of four banks.

FIG. 19 illustrates an example of the interleave read operation profile in the page address mapping of FIG. 18.

DETAILED DESCRIPTION OF THE PREFERRED EMBODIMENTS

A structure of memory cell array in a flash memory as an example of the semiconductor memory of the present invention will be described first.

Figure 9:
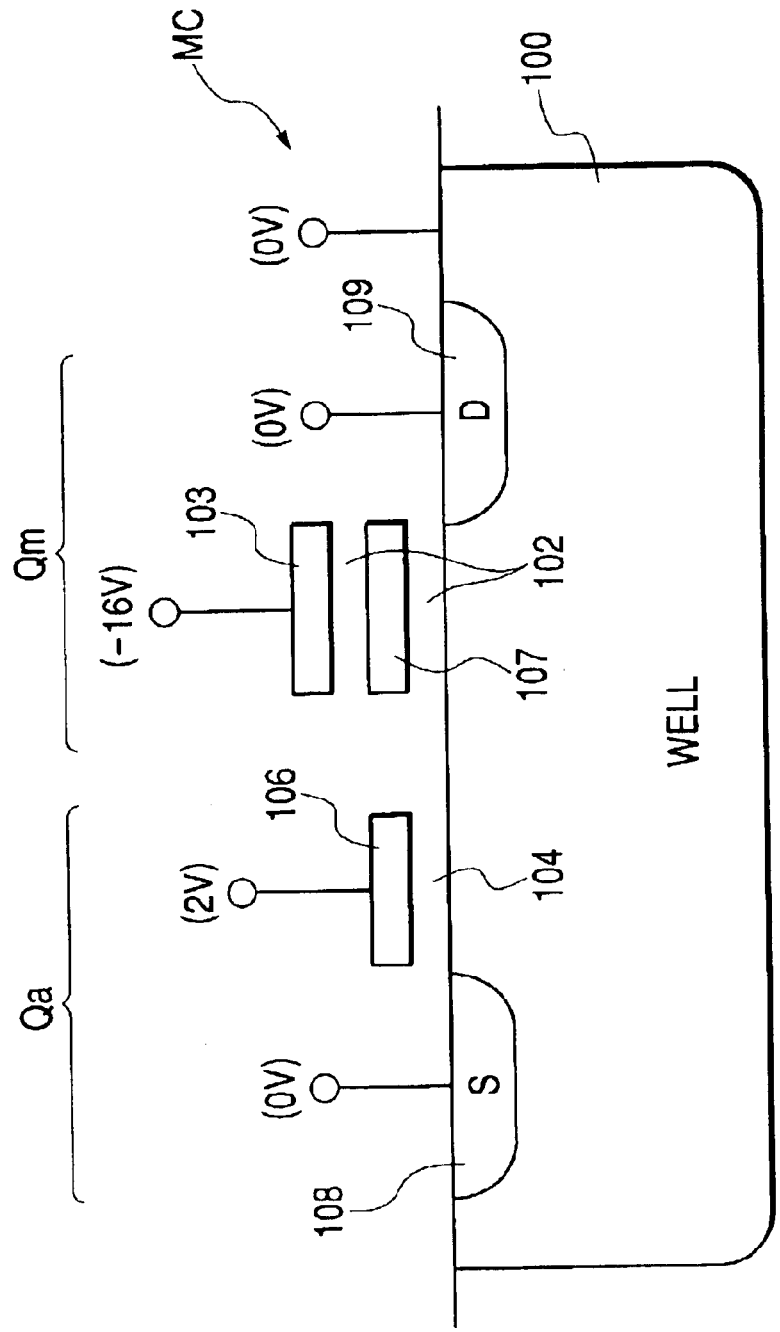
FIG. 9 is a vertical cross-sectional view illustrating a device structure of the flash memory cell and voltage application condition of erase operation.

FIG. 9 illustrates a cross-sectional structure of the flash memory. A nonvolatile memory cell MC is configured by forming a source electrode 108, a drain electrode 109 and a channel region on a semiconductor region (well region) 100, forming an assist MOS transistor section Qa in the side of the source electrode 108, while a memory MOS transistor section Qm in the side of the drain electrode 109. The assist MOS transistor section Qa includes an assist gate 106 on the channel region via a gate oxide film 104. The memory MOS transistor section Qm includes a floating gate 107 and a memory gate electrode 103 as the control gate on the channel region via a gate oxide film 102.

Figure 10:
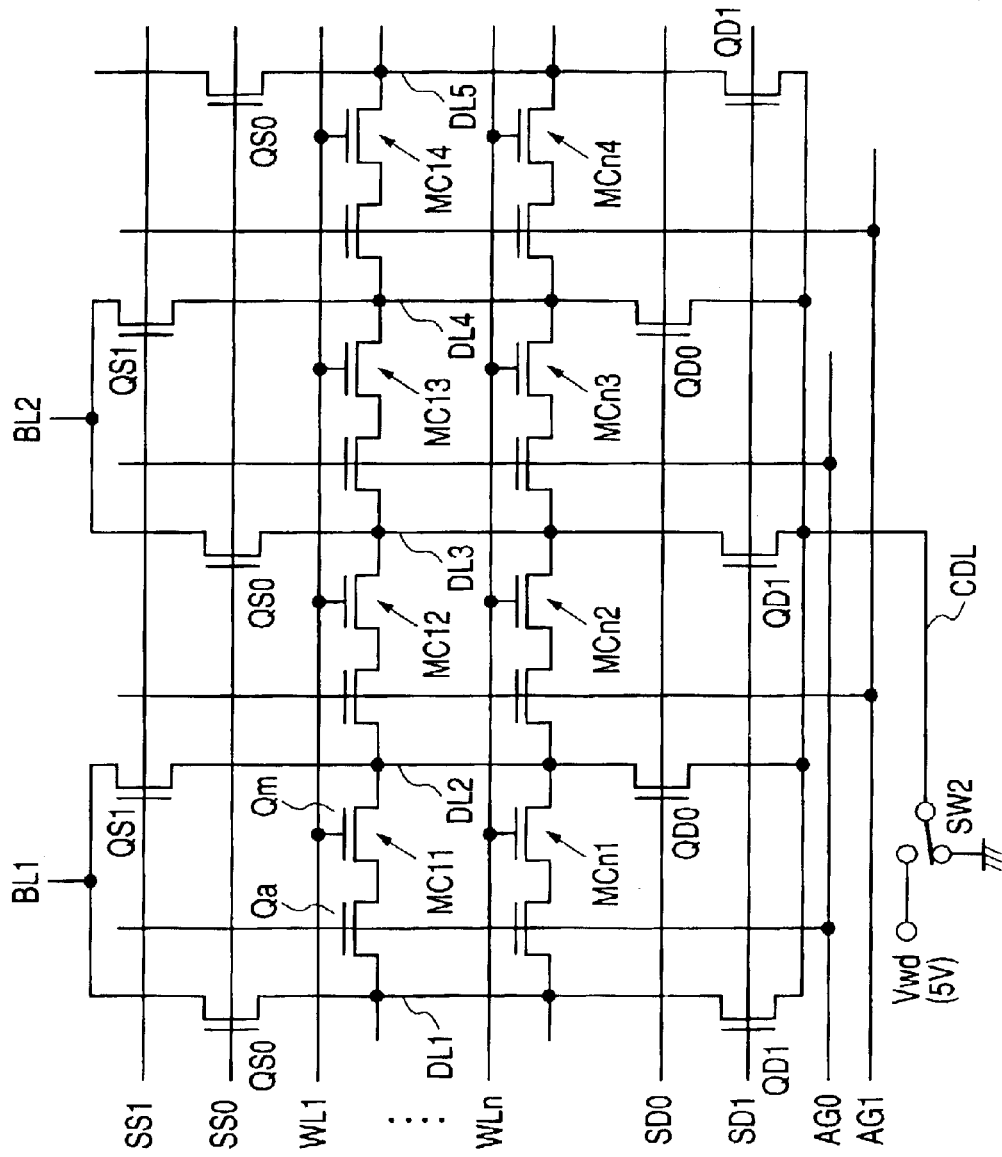
FIG. 10 is a circuit diagram illustrating a flash memory cell array.

FIG. 10 illustrates an example of a flash memory array (also referred to as only a memory cell array). Typical nonvolatile memory cells MC11 to MC14, MCn1 to MCn4 are allocated in a matrix, the memory gate electrodes 103 of the nonvolatile memory cells MC11 to MC14 allocated in the same raw are connected with a word line WL1, and the memory gate electrodes 103 of the nonvolatile memory cells MCn1 to MCn4 allocated in the same raw are connected with the word lines WLn. The nonvolatile memory cells MC11 to MC14 of the same raw are connected in series between the adjacent memory cells via the source electrode 108 and drain electrode 109. In the same manner, the nonvolatile memory cells MCn1 to MCn4 of the same raw are connected in series between the adjacent memory cells via the source electrode 108 and rain electrode 109 and these serially connected nodes are connected in the unit of column with the data lines DL1, DL2, DL3, DL4 and DL5.

One end of the data lines DL1 to DL5 is provided with source selection MOS transistors QS0, QS1 of the memory cell, while the other end thereof is provided with drain selection MOS transistors QD0, QD1 of the memory cell. The MOS transistor QS0 individually connects the source electrodes 108 of the memory cells MC11, MC13, MCn1, MCn3 of the odd numbers to the corresponding bit lines BL1, BL2, . . . , the MOS transistor QS1 individually connects the source electrodes 108 of the memory cells MC12, MC14, MCn2, MCn4 of the even numbers to the corresponding bit lines BL1, BL2, . . . and these MOS transistors QS0, QS1 are selectively turned ON with the control signals SS0, SS1 in the write/read operation. The MOS transistor QD0 connects in common the drain electrodes 109 of the memory cells MC11, MC13, MCn1, MCn3 of the odd numbers to the common data line CDL, the MOS transistor QD1 connects in common the drain electrodes 109 of the memory cells MC12, MC14, MCn2, MCn4 of the even numbers to the common data line CDL and these MOS transistors QD0, QD1 are selectively turned ON with the control signals SD0, SD1 in the write/read operation.

The assist gates 106 of the memory cells MC11, MC13, MCn1, MCn3 of the odd numbers are switch-controlled with a control signal AG1, while the assist gates 106 of the memory cells MC12, MC14, MCn2, MCn4 of the even numbers are switch-controlled with a control signal AG1. Thereby, any one is turned ON in the write/read operation. The actual flash memory cell array is formed in a large scale but only a part thereof is illustrated to simplify the figure.

Storage data is stored in the nonvolatile memory cell by utilizing that a threshold voltage of memory cell changes depending on the amount of charge stored in a floating gate 107. In this case, the threshold voltage of memory cell is limited within the desired range depending on the value of storage data and the threshold voltage distribution is called a memory threshold value distribution. In this example, only one nonvolatile memory cell stores information of 2 bits and four kinds of memory threshold voltage distribution are determined corresponding to the "01, 00, 10, 11" data of storage information. Namely, information storage condition of one memory cell can be selected from the erase condition ("11") as a fourth threshold voltage (Vth4) condition, a first write condition ("10") as a first threshold voltage (Vth1) condition, a second write condition ("00") as a second threshold voltage (Vth2) condition and a third write condition ("01") as a third threshold voltage (Vth3) condition. Although not particularly restricted, the threshold voltages have the relationship of Vth4<Vth1<Vth2<Vth3. Four information storage conditions in total are determined with the data of 2 bits. In order to obtain the memory threshold voltage distribution described above, the write voltage applied to the word line during the write operation after the erase operation is set to three kinds of voltages which are different from each other, these three kinds of voltages are sequentially switched and the write operation is performed in the divided three stages.

First, the erase operation to the memory cell can be performed, as illustrated in FIG. 9, by applying −16V to the word line (memory gate electrode) WLn, applying 2V to the assist gate 106 and then applying 0V to the source electrode 108, drain electrode 109 and well region 100 to release voltage to the well region 100 from the floating gate 107 through the FN tunnel. The erase operation can be performed in unit of word line without relation to the memory cells of the even numbers and odd numbers.

Figure 11:
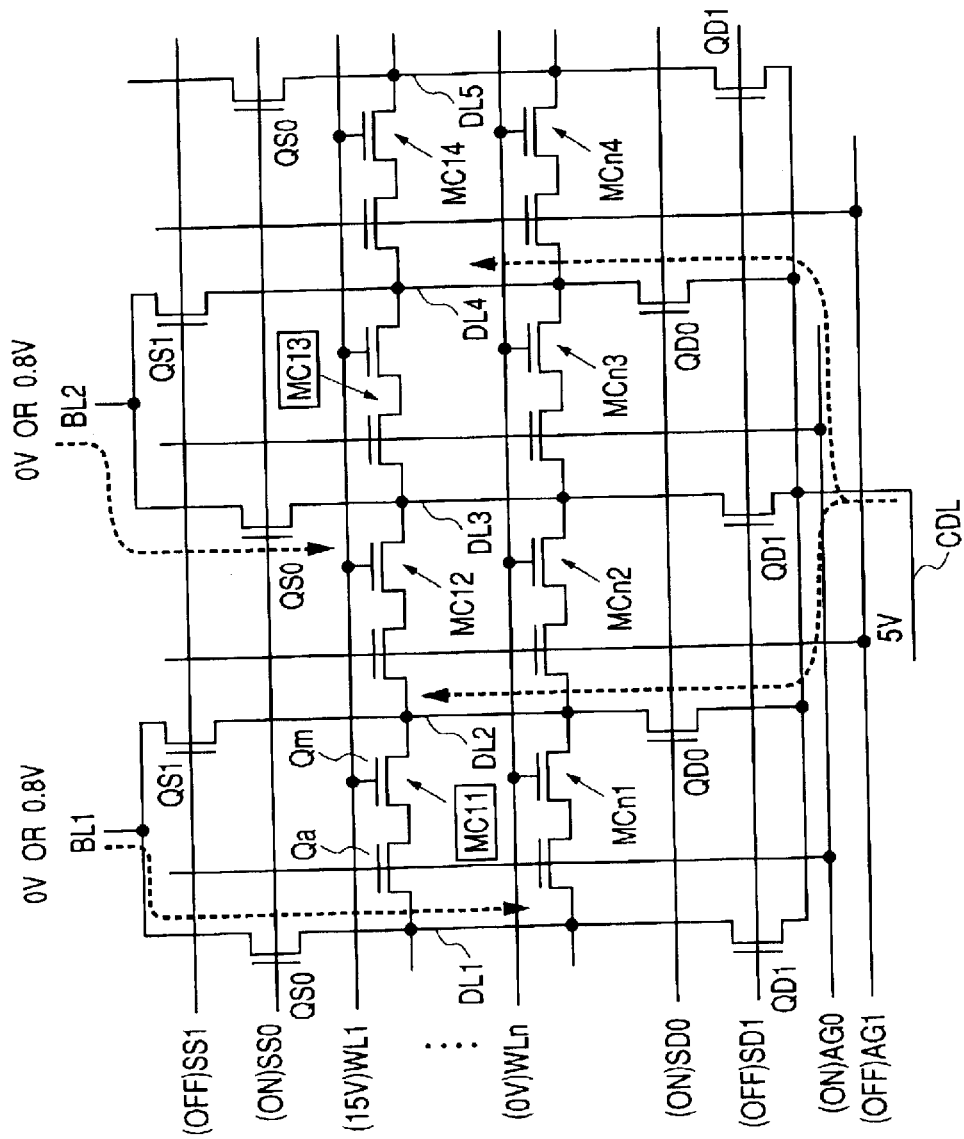
FIG. 11 is a circuit diagram illustrating a voltage application condition of write operation to the memory cells of the odd numbers in the flash memory cell array.
Figure 12:
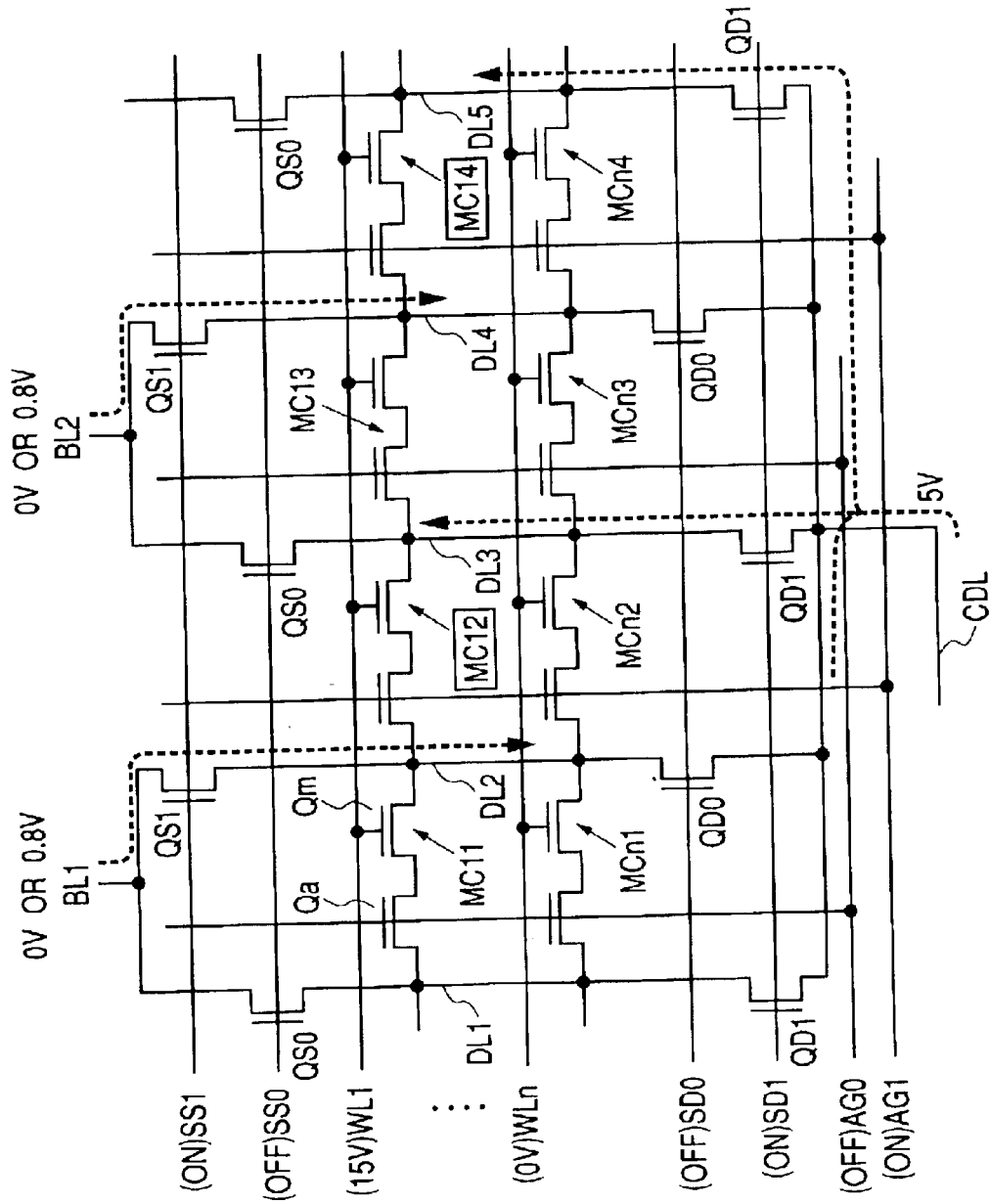
FIG. 12 is a circuit diagram illustrating a voltage application condition of write operation to the memory cells of the even numbers in the flash memory cell array.

The write operation may be sorted to the write operation of the memory cells of the odd numbers (write operation of odd numbers) for the memory cells of the odd numbers among the memory cells using in common the selected word line as illustrated in FIG. 11 and to the write operation of the memory cells of the even numbers (write operation of even numbers) for the memory cells of the even numbers among the memory cells using in common the selected word line as illustrated in FIG. 12.

In the write operations of the odd numbers, the source electrodes 108 of the memory cells MC11, MC13, MCn1, MCn3 of the odd numbers are connected, as illustrated in FIG. 11, to the bit lines BL1, BL2 with the control signals SS0, SD0, AG0 of the selection level, while the drain electrodes 109 are connected to the common data line CDL. In the write operations of the even numbers, the source electrodes 108 of the memory cells MC12, MC14, MCn2, MCn4 of the even numbers are connected, as illustrated in FIG. 12, to the bit lines BL1, BL2 with the control signals SS1, SD1, AG1 of the selection level, while the drain electrodes 109 are connected to the common data line CDL. For example, in FIG. 11, a writer selection signal, for example, 15V is applied to the word line WL1, 5V is impressed to the common data line CDL, 0V is impressed to the bit line of write selection and 0.8V is applied to the bit lines not selected for write operation. In this case, the selection level of the control signals AG0, AG1 is set, for example, to 0.6V which is lower than the voltage of 0.8V of the non-selected bit line. Accordingly, in the memory cells selected for write operation, the assist MOS transistor section Qa is turned ON and a drain current flows. Therefore, hot electrons are generated at the boundary between the assist MOS transistor section Qa and memory MOS transistor section and these hot electrons are injected to the floating gate to generate change in the threshold voltage. In the memory cells not selected for write operation, the assist MOS transistor section Qa is maintained in the OFF state and therefore hot electron is never generated and thereby the write operation is inhibited.

The three kinds of write threshold voltage controls may be realized with time control in the high voltage condition and moreover with the level control in the high voltage impressed to the word line. Whether 0V should be applied or 0.8V should be applied to the bit line is determined depending on a logical value of the write control information which is latched by a sense latch circuit SL described later. For example, the control is performed not to select the write operation when the latch data of the sense latch circuit SL has the logical level "1" and to select the write operation when the latch data of the sense latch circuit SL has the logical level "0". Whether any one level of "1" and "0" should be set to the sense latch SL during the write operation is determined by the control section CNT conforming to the write data on the buffer memory depending on the write threshold voltage condition for the write operation.

The read operation for the stored information can be performed by setting three kinds of voltages as the word line selection level to be applied to the word line, executing three times of read operation in maximum while the three kinds of word line selection levels are sequentially changed and then judging the stored information of two bits based on the binary value (1 bit) read from the memory cell in the individual read operations.

Figure 13:
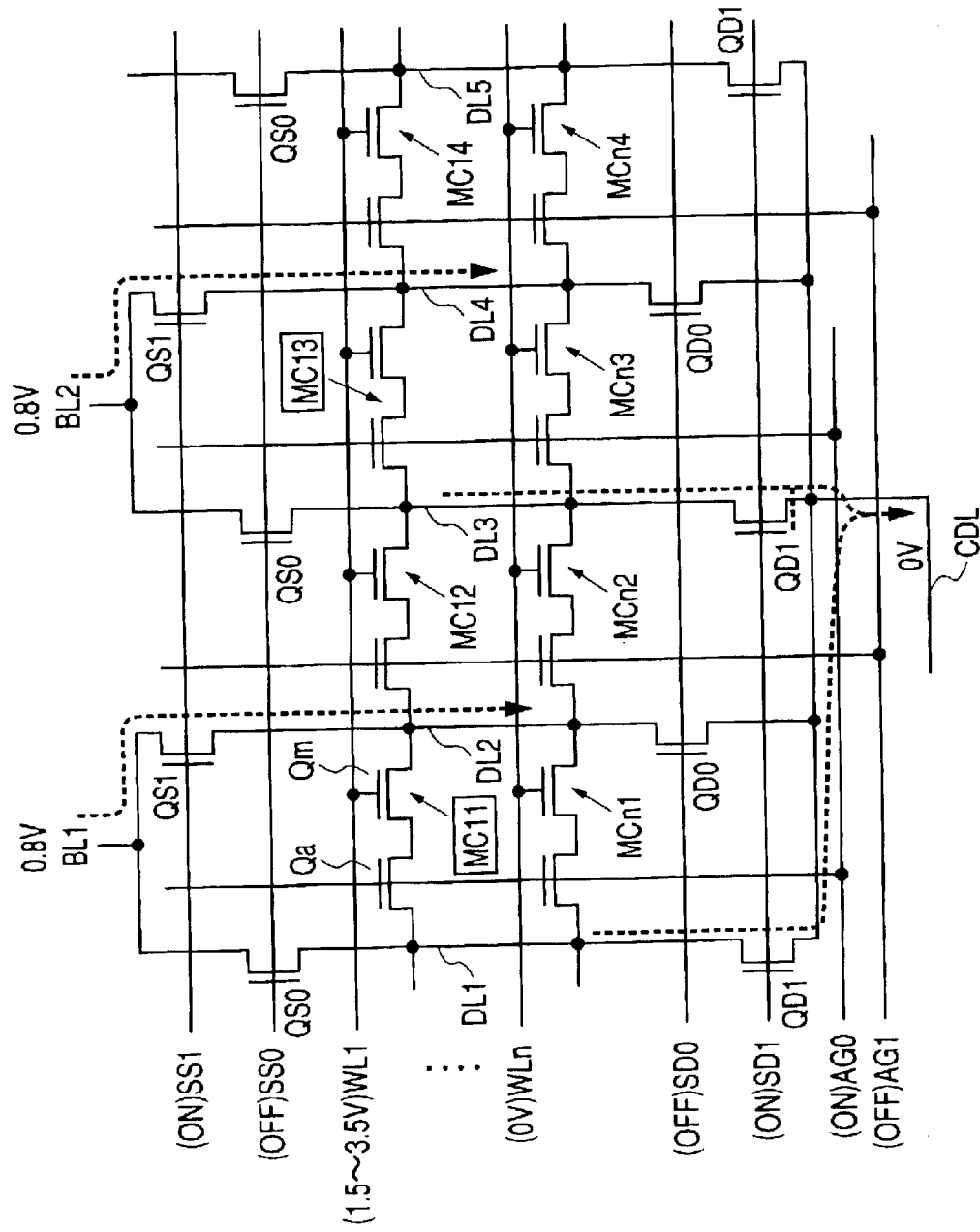
FIG. 13 is a circuit diagram illustrating a voltage application condition of read operation to the memory cells of the odd numbers in the flash memory cell array.
Figure 14:
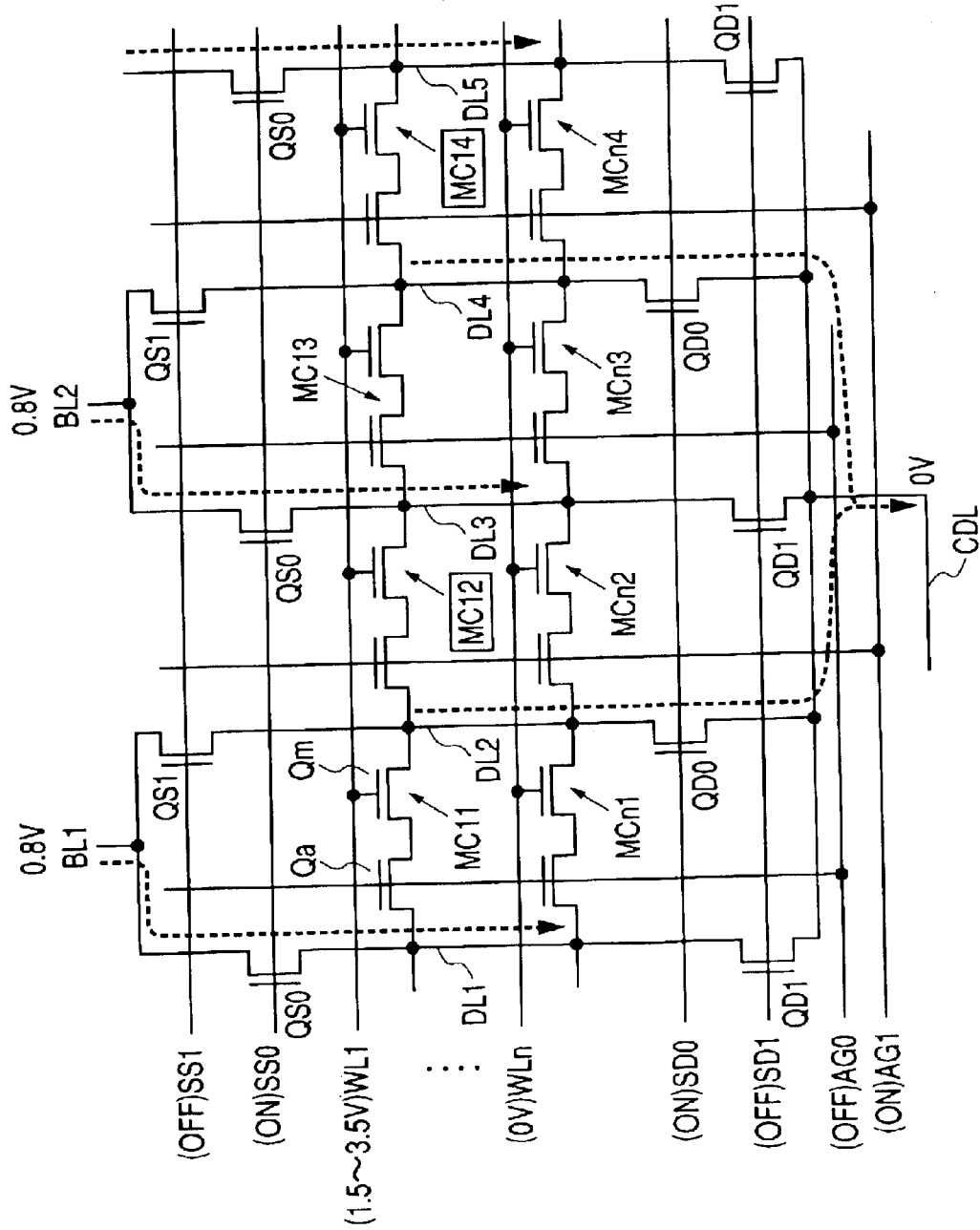
FIG. 14 is a circuit diagram illustrating a voltage application condition of read operation to the memory cells of the even numbers in the flash memory cell array.

The read operation is also sorted to the read operations of the odd numbers for the memory cells MC11, MC13, MCn1, MCn3 of the odd numbers in the memory cells using in common the selected word lines as illustrated in FIG. 13 and the read operations of the even numbers for the memory cells MC12, MC14, MCn2, MCn4 of the even numbers in the memory cells using in common the selected word lines as illustrated in FIG. 14.

In the read operations of the odd numbers, the drain electrodes 109 of the memory cells MC11, MC13, MCn1, MCn3 of the odd numbers are connected, as illustrated in FIG. 13, to the bit lines BL1, BL2 with the control signals SS1, SD1, AG0 of the selection level, while the source electrodes are connected to the common data line CDL. In the read operations of the even numbers, the drain electrodes 109 of the memory cells MC12, MC14, MCn2, MCn4 of the even numbers are connected, as illustrated in FIG. 14, to the bit lines BL1, BL2 with the control signals SS0, SD0, AG1 of the selection level, while the source electrodes 108 are connected to the common data line CDL.

For example, in FIG. 13, a read selection voltage, for example, 1.5V to 3.5V is applied to the word line WL1, 0V is impressed to the common data line CDL and the bit line is precharged to 0.8V. In this case, when the word line selection level is higher than the threshold voltage of the memory cell, a drain current flows. Change of drain current is detected with a sense amplifier provided for the bit lines BL1, BL2.

As described above, when the structure of nonvolatile memory cell and memory cell array is introduced, the write operation and read operation must be done individually for the memory cells using in common the word line of the odd numbers and even numbers. Erase operation may be performed in unit of word line.

Figure 15:
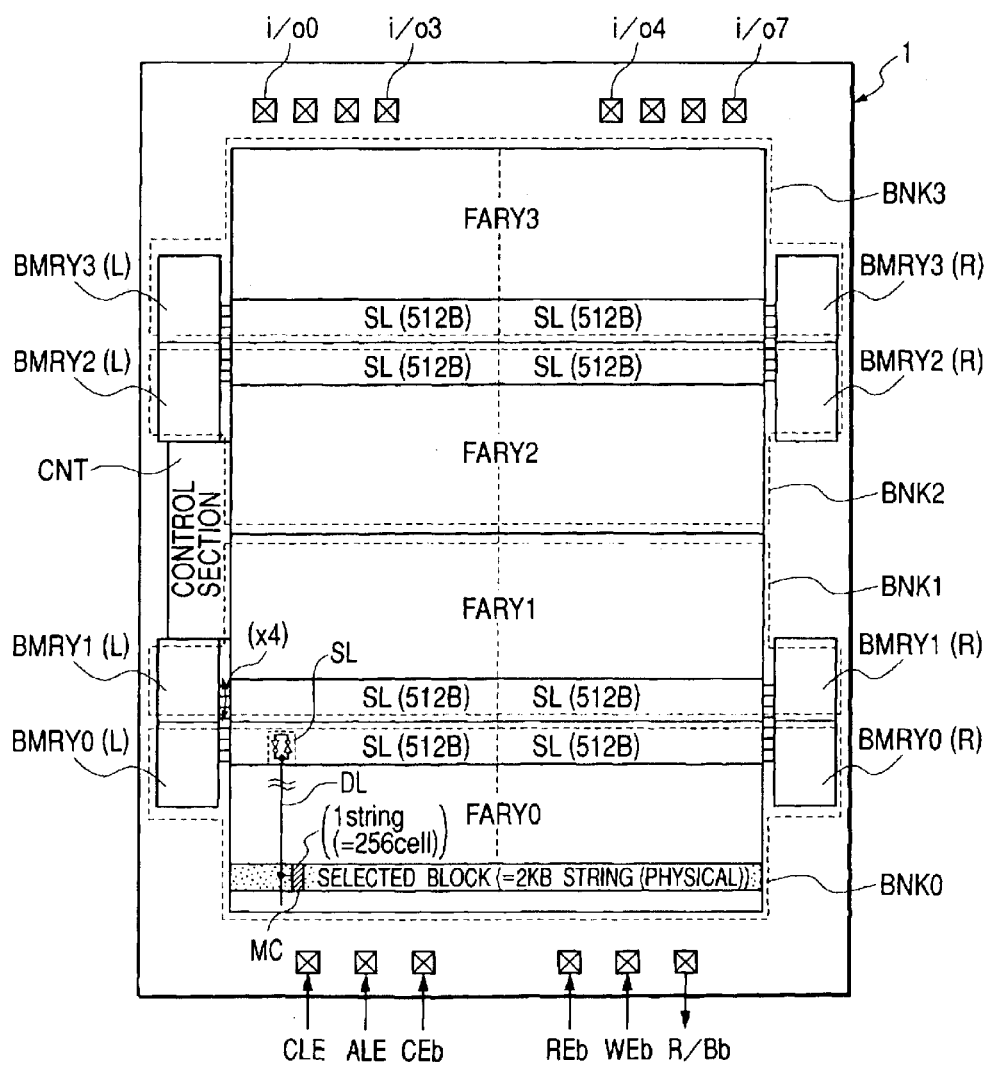
FIG. 15 is a block diagram illustrating a flat layout structure of the flash memory as an example of the semiconductor memory of the present invention.

FIG. 15 illustrates a flat layout structure of a flash memory as an example of the semiconductor memory of the present invention. The flash memory 1 illustrated in this figure is formed, although not particularly restricted, on one semiconductor substrate (chip) like a single crystalline silicon with the well known MOS integrated circuit manufacturing method.

The flash memory 1 includes, for example, four memory banks BNK0 to BNK3 and a control section CNT. The memory banks BNK0 to BNK3 include flash memory arrays FARY0 to FARY3 as the nonvolatile memory section and buffer memories BMRY0 to BMRY3 as the buffer section. Corresponding to one flash memory array, the buffer memory is divided to two sections and are allocated in the right and left sides. For the convenience of description, the right side buffer memory is given the suffix (R), while the left side buffer memory is given the suffix (L).

The external input/output terminals i/o0 to i/o7 of the flash memory 1 are also used in common as the address input terminal, data input terminal, data output terminal and command input terminal. The flash memory 1 inputs, as an external control signal, for example, as a strobe signal, the command latch enable signal CLE, address latch enable signal ALE, chip enable signal CEb, read enable signal REb and write enable signal WEb and outputs the ready busy signal R/Bb. The chip enable signal CEb indicates the chip selection condition to the flash memory 1, while the read enable signal REb indicates the read operation from the external input/output terminal i/o0 to i/o7 and the write enable signal WEb indicates the write operation from the external input/output terminals i/o0 to i/o7. The command latch enable signal CEL means that a command is supplied to the external input/output terminals i/o0 to i/o7 from the external side, while the address latch enable signal ALE means that an address signal is supplied to the input/output terminals i/o0 to i/o7 from the external side. The ready busy signal R/Bb indicates, with the low level thereof (L), that the erase, write or read operation is being performed (busy condition) to any one of the flash memory arrays FARY0 to FARY3. The busy condition or ready condition to every flash memory array (FARY0 to FARY3) can be recognized from the external side by reading the status information.

The control section CNT controls the signal interface function for the external side depending on the condition of the strobe signal and also controls the internal operation depending on the input command.

The respective flash memory arrays FARY0 to FARY3 include many nonvolatile memory cells allocated in a matrix. These nonvolatile memory cells are formed, although not particularly restricted, as the flash memory cells described in regard to FIG. 9. In FIG. 15, only one nonvolatile memory cell MC and only one data line DL are typically illustrated. Moreover, one end of the data line DL is connected to the sense latch SL formed of a static latch circuit via a selector or the like not illustrated.

In the flash memory 1 of FIG. 15, the storage information of 512 bytes are called one sector. The information storage unit for write and read operations is 2048 bytes (=4 sectors) and this unit is called one page. 1024 bytes are also expressed as 1 k-byte. One page is designated with a page address. In the flash memory, for separation of field elements, information storage unit for erase operation is set to two times (=4096 bytes) the unit of write operation and this unit is called one block. Designation of page address of even number in the erase operation mode is defined as designation of block.

As described above, one nonvolatile memory cell realizes information storage of 2 bits in the flash memory 1.

Therefore, in each flash memory array FARY0 to FARY3, the 2048 nonvolatile memory cells are connected to one word line, the page address information designates the memory cells enough for 1024 bytes of the even numbers and odd numbers to corresponding one word line and the sense latches SL enough for 1024 bytes are provided in parallel corresponding on one to one basis to the memory cells enough for 1024 bytes designated with the page address information. The page address information designates the page address in the entire memory banks, the least significant bit designates the even or odd page addresses, the significant bits designate the word lines and least significant two bits designate memory banks. The word line is selected with word line selection decoder not illustrated, the data lines in unit of the even number or odd number pages are selected with an even number data line selector consisting of the switch MOS transistors QS0, QS1, QD0, QD1 or the like not illustrated, and the data lines DL enough for 1024 bytes selected with this even number data line selector are connected to the sense latches SL enough for 1024 bytes. In the erase mode, the even number page address is considered as the block address (address of one word line and 2 pages).

The erase, write and read operations of the flash memory arrays FARY0 to FARY3 are controlled with the control section CNT. In this case, the voltage application condition for the data line and word line is controlled as described with reference to FIG. 9 to FIG. 14.

The buffer memories BMRY0 to BMRY3 are configured, for example, with an SRAM (Static Random Access Memory) to temporarily store the write data inputted as the binary data to the external input/output terminals i/o0 to i/o7 from the external side and the binary read data outputted from the external input/output terminals i/o0 to i/o7. The buffer memories BMRY0 to BMRY3 are divided to two sections in the right and left sides for each memory bank and the buffer memories BMRY0 to BMRY3 for each memory bank are respectively provided, in the right and left sides thereof, with the storage capacity equal to the write unit and read unit in the flash memory arrays. For example, in the case of flash memory 1, since the write information unit and read information unit are defined as one page (=2K bytes), the respective buffer memories BMRY0(L), BMRY0 (R) to BMRY3(L), BMRY3(R) as the on-chip buffer have the storage capacity of 2K bytes. The buffer memories BMRYi (L) or BMRYi(R) are interfaced with the external input/output terminals i/o0 to i/o7. The left side buffer memory BMRYi(L) is selected when the page address information indicates odd number page, while the right side buffer memory BMRYi(R) is selected when the page address information indicates even number page.

FIG. 16 schematically illustrates connections among the flash memory arrays FARY0 to FARY3, buffer memories BMRY0(L), BMRY0(R) to BMRY3(L), BMRY3(R), and input/output terminals i/o0 to i/o7. The right side buffer memory BMRYi(R) or left side buffer memory BMRYi(L) and output terminals i/o0 to i/o7 are connected as schematically illustrated through selection only with the selectors SEL (R) and SEL (L).

As described above, a set of buffer memories BMRY0 to BMRY3 is allocated for each memory bank and the buffer memories allocated to the same memory bank are used for the same flash memory under the preferable correspondence. According to the operation mode, the buffer memory not in the preferential correspondence may be used. These buffer memories are controlled with the control section CNT depending on the command and address.

Data input or output between the flash memory array and buffer memory is performed in unit of 8 bits or 16 bits. The sense latch SL in unit of 8 bits in the flash memory arrays FARY0 to FARY3 is selected with the sense latch selection circuit not illustrated. The buffer memories BMRY0 to BMRY3 may be accessed in unit of 8 bits. Data transfer between the flash memory arrays FARY0 to FARY3 and buffer memories BMRY0 to BMRY3 and access control for the buffer memories BMRY0 to BMRY3 are performed by the control section CNT based on the command and access address information supplied from the external side.

<<Doubled Buffer Memory Size of Access Unit>>

First, the interleave operation in the structure where the buffer memory size of memory bank is two times the access unit will be described.

Figure 1:
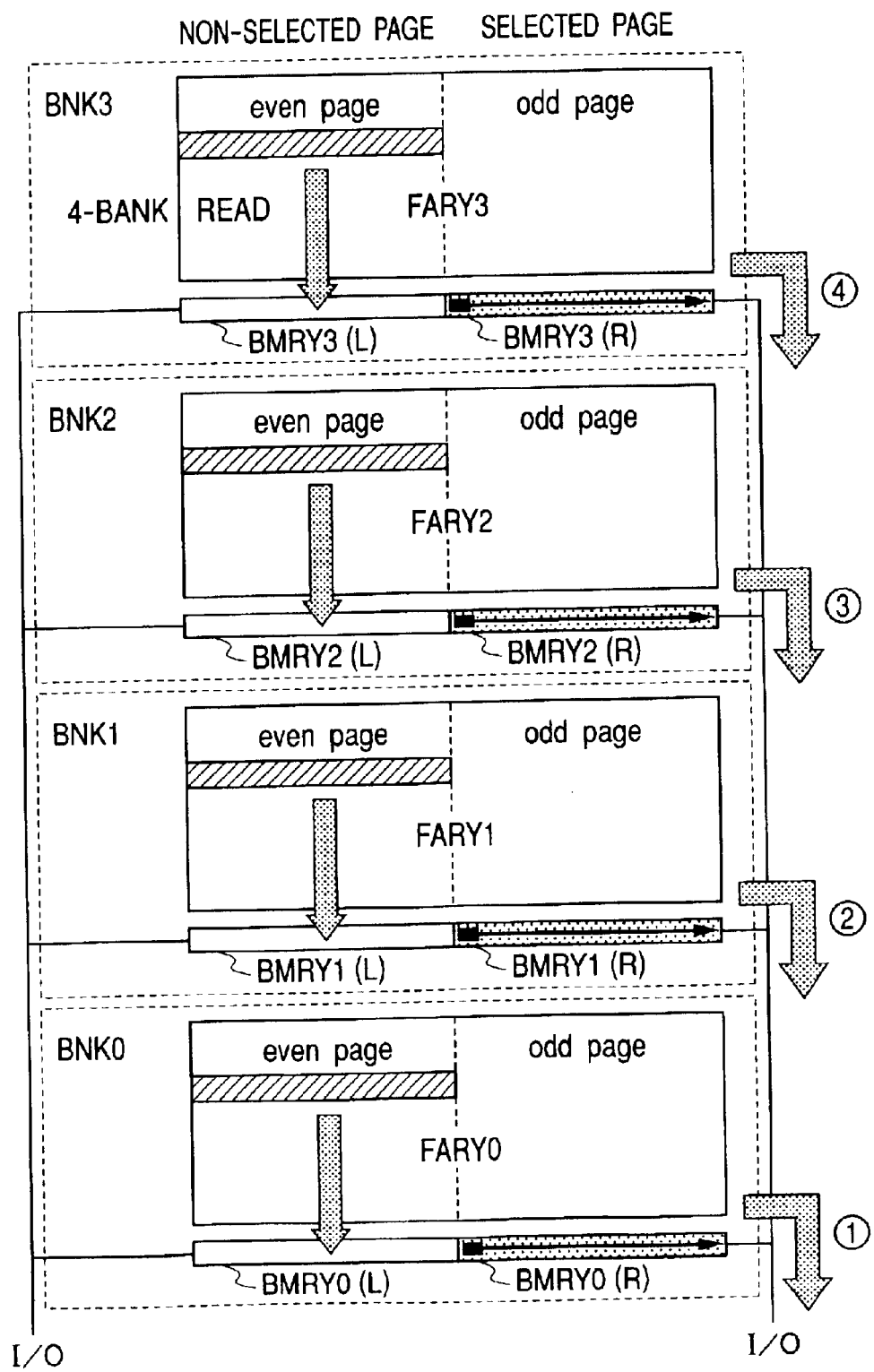
FIG. 1 illustrates a profile of 4-bank parallel interleave read operation of a flash memory as an embodiment of the present invention.
Figure 2:
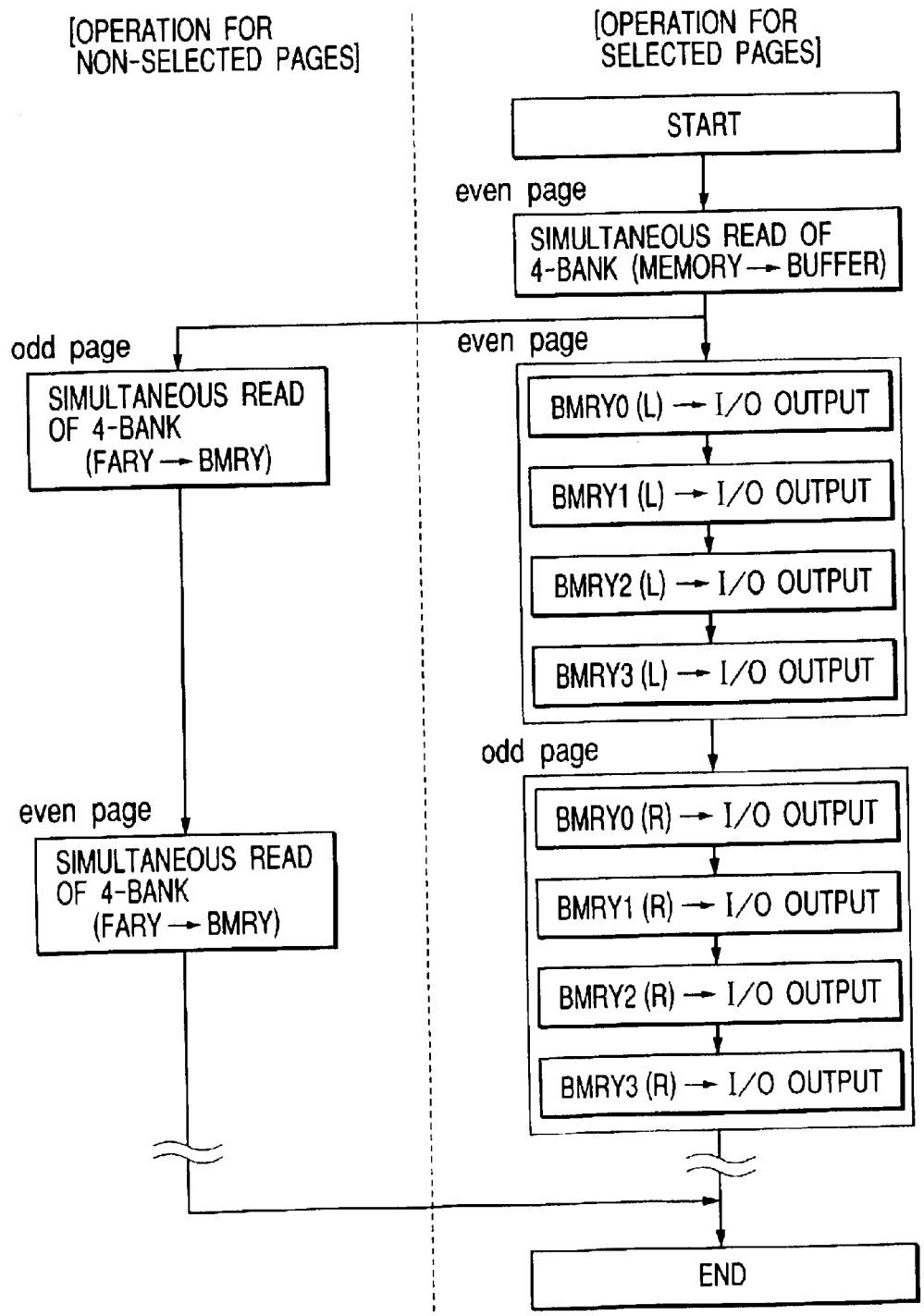
FIG. 2 is a flowchart illustrating the control sequence of the interleave read operation of FIG. 1.

FIG. 1 illustrates the 4-bank parallel interleave read operation profile of the flash memory 4. When the 4-bank parallel interleave read operation is instructed from the external side, the read operation to the flash memory arrays FARY0 to FARY3 is alternately performed in parallel for 4-bank in the odd pages and even pages. For example, in FIG. 1, the read data is stored to the buffer memories BMRY0(R) to BMRY3(R) for even pages. In parallel to this storage, the read data stored in the buffer memories BMRY0 (L) to BMRY3(L) for odd pages is sequentially outputted for every buffer memory. The output sequence is determined as ①②③④ in FIG. 1. FIG. 2 illustrates the control sequence of the interleave read operation. This control is performed with the control section CNT. The selected page means the selection page for external output, while I/O output means an external output.

Figure 3:
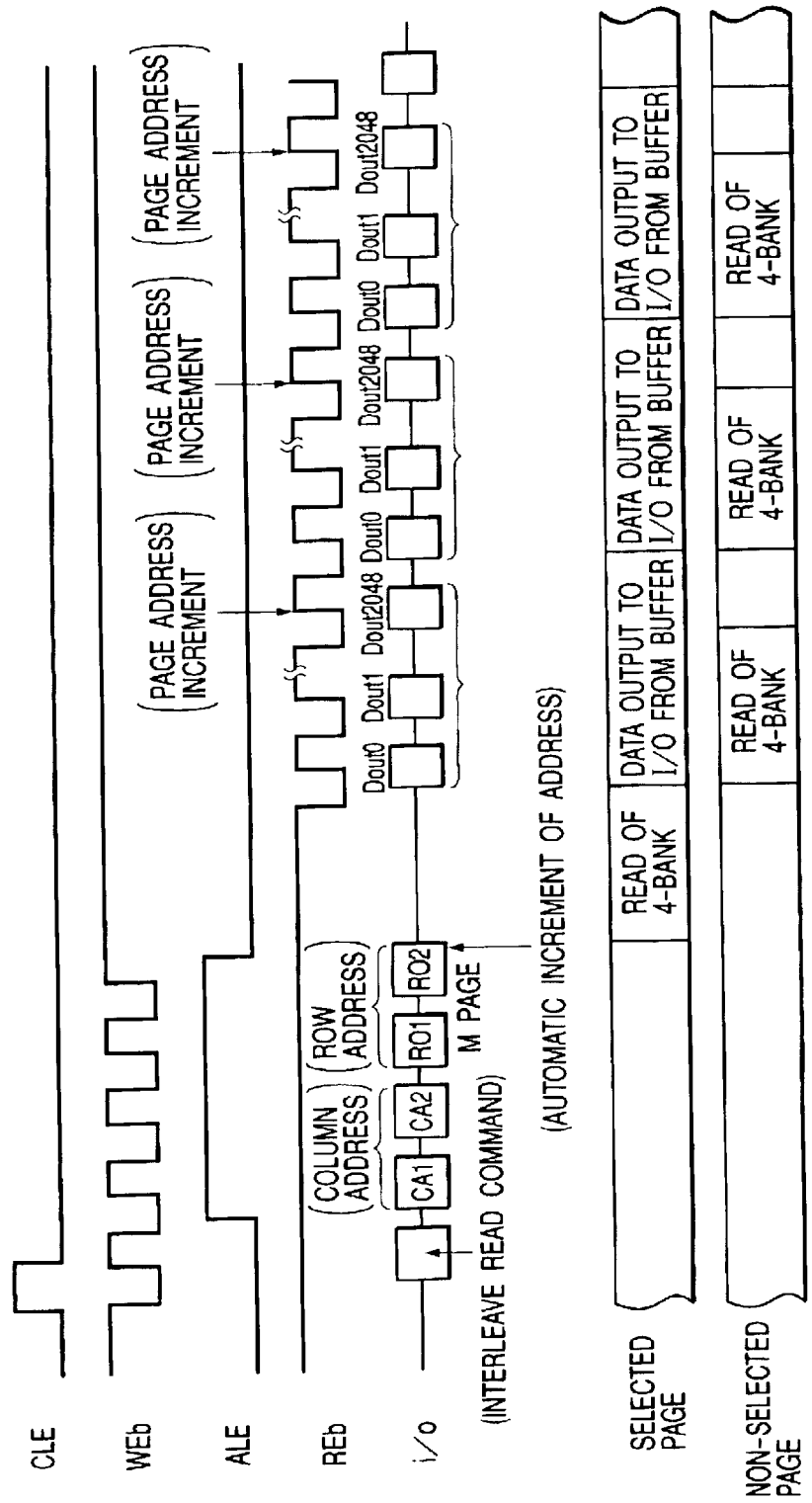
FIG. 3 is a timing chart of the interleave read operation of FIG. 1.

FIG. 3 illustrates the timing chart of the 4-bank parallel interleave read operation. A column address and a raw address are inputted following the interleave read command code. The column address is defined as the intra-page lead address, while the raw address is defined as the initial value of the page address. The control section CNT performs the read operation for the selection page address of each flash memory array FARY0 to FARY3 by decoding this command and transfers data, for example, to the buffer memories BMRY0(L) to BMRY3(L) and then reads the transferred data from the buffer memories BMRY0(L) to BMRY3(L). In parallel to this read operation, the read operation is executed to the next page address of each flash memory array FARY0 to FARY3 and thereby the data is transferred, for example, to the buffer memories BMRY0(R) to BMRY3(R). Operation to store the read data of the flash memory array to the buffer memory is performed hereafter in parallel with the operation to output the storage information of buffer memory to the external side. Although not particularly restricted, this interleave operation is continued until the chip is not selected with the control signal CEb.

Figure 4:
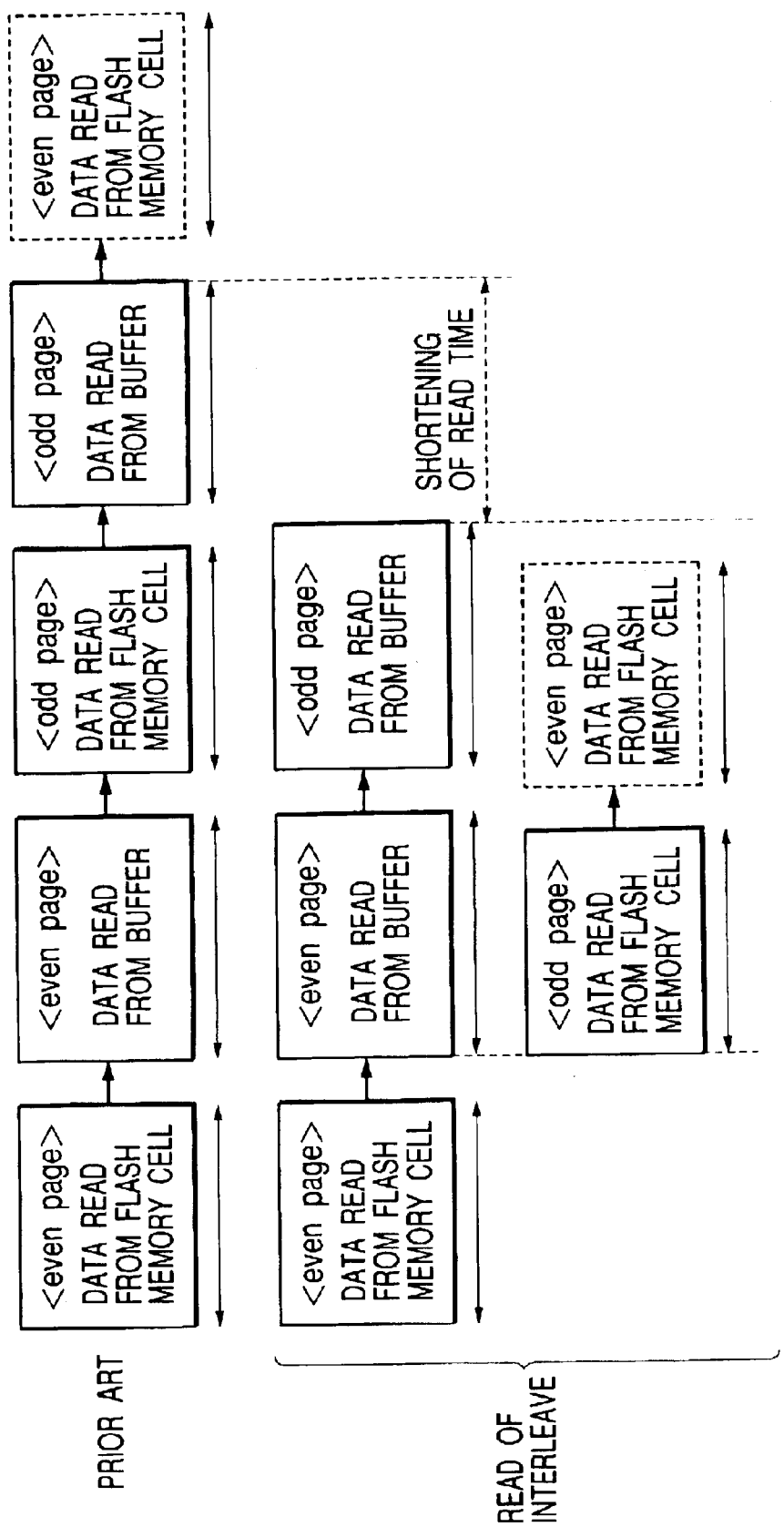
FIG. 4 illustrates comparison between the interleave read operation of FIG. 1 and the interleave operation of the prior art.

FIG. 4 illustrates an example of comparison between the 4-bank parallel interleave read operation of flash memory 1 and the read operation in the prior art. The read operation time can be shortened in comparison with that in the prior art by performing in parallel the operation to store the read data of the flash memory array to the buffer memory and the operation to output the stored information of the buffer memory to the external side.

Figure 5:
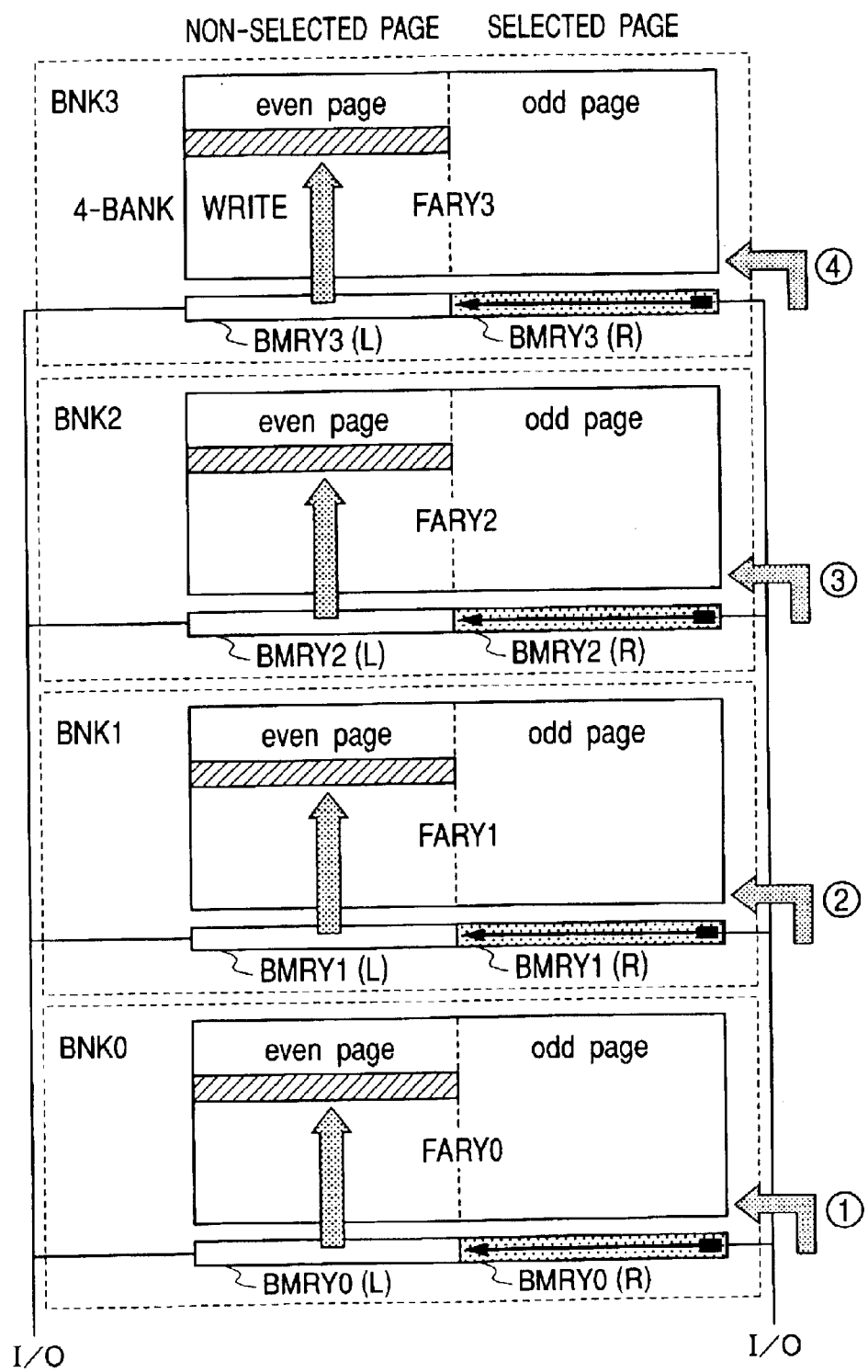
FIG. 5 illustrates a profile of 4-bank parallel interleave write operation of a flash memory.
Figure 6:
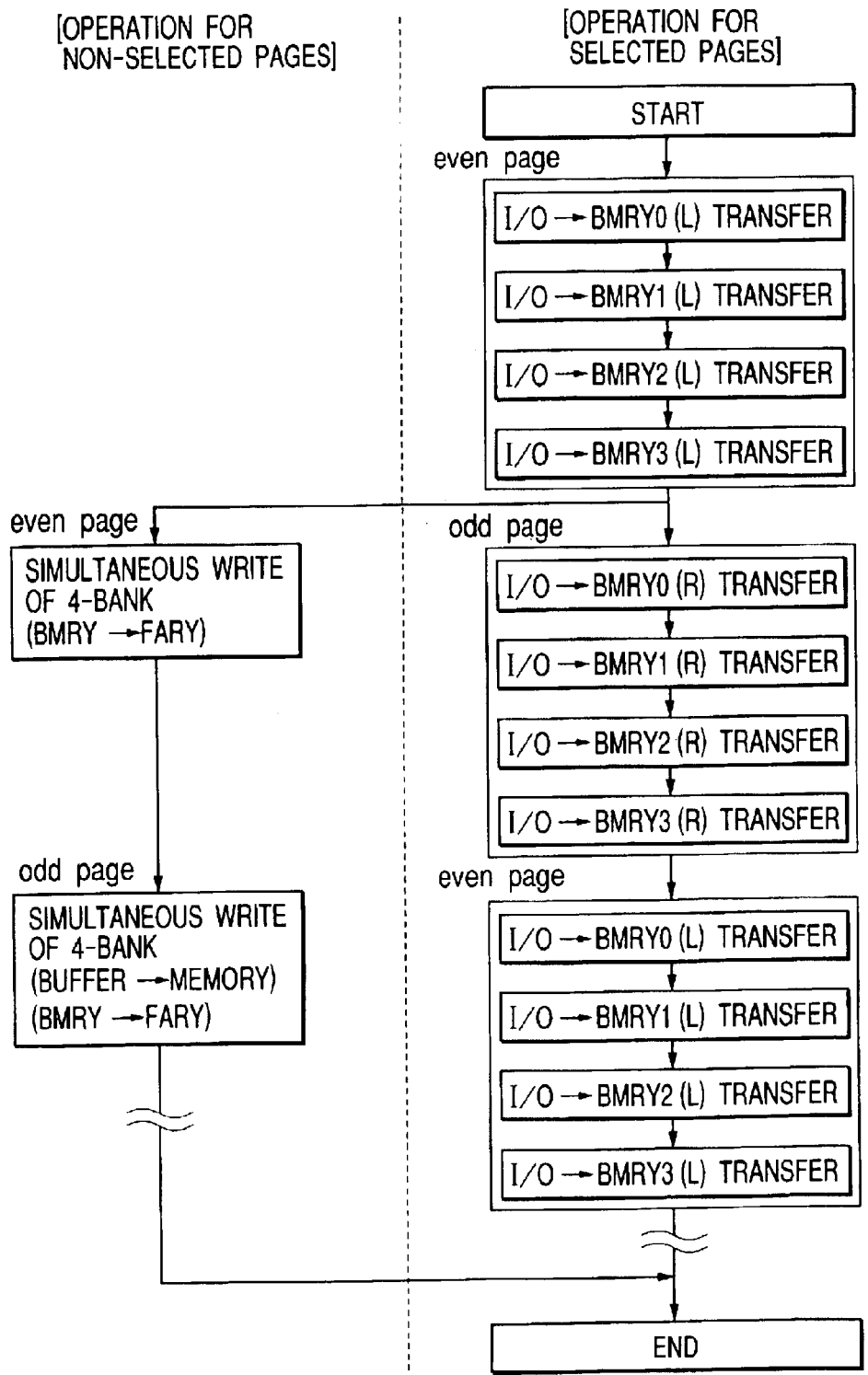
FIG. 6 is a flowchart illustrating the control sequence of the interleave write operation of FIG. 5.

FIG. 5 illustrates the 4-bank parallel interleave write operation profile of the flash memory 1. When the 4-bank parallel interleave write operation is instructed from the external side, the write data is sequentially stored, from the external side, to the buffer memory depending on the even or odd address of the page address. For example, the write data is stored to the buffer memories BMRY0(R) to BMRY3(R) of the odd pages in FIG. 5. Storing sequence is defined as ①②③④ in FIG. 5. In parallel to this write operation, the write data already stored in the buffer memories BMRY0(L) to BMRY3(L) of the even pages is then written to the flash memory arrays FARY0 to FARY3. This write operation is conducted in parallel to the four flash memory arrays FARY0 to FARY3. FIG. 6 illustrates the control sequence of the interleave write operation. This control is performed with the control section CNT. The selected page means the selected page for write data input from the external side.

Figure 7:
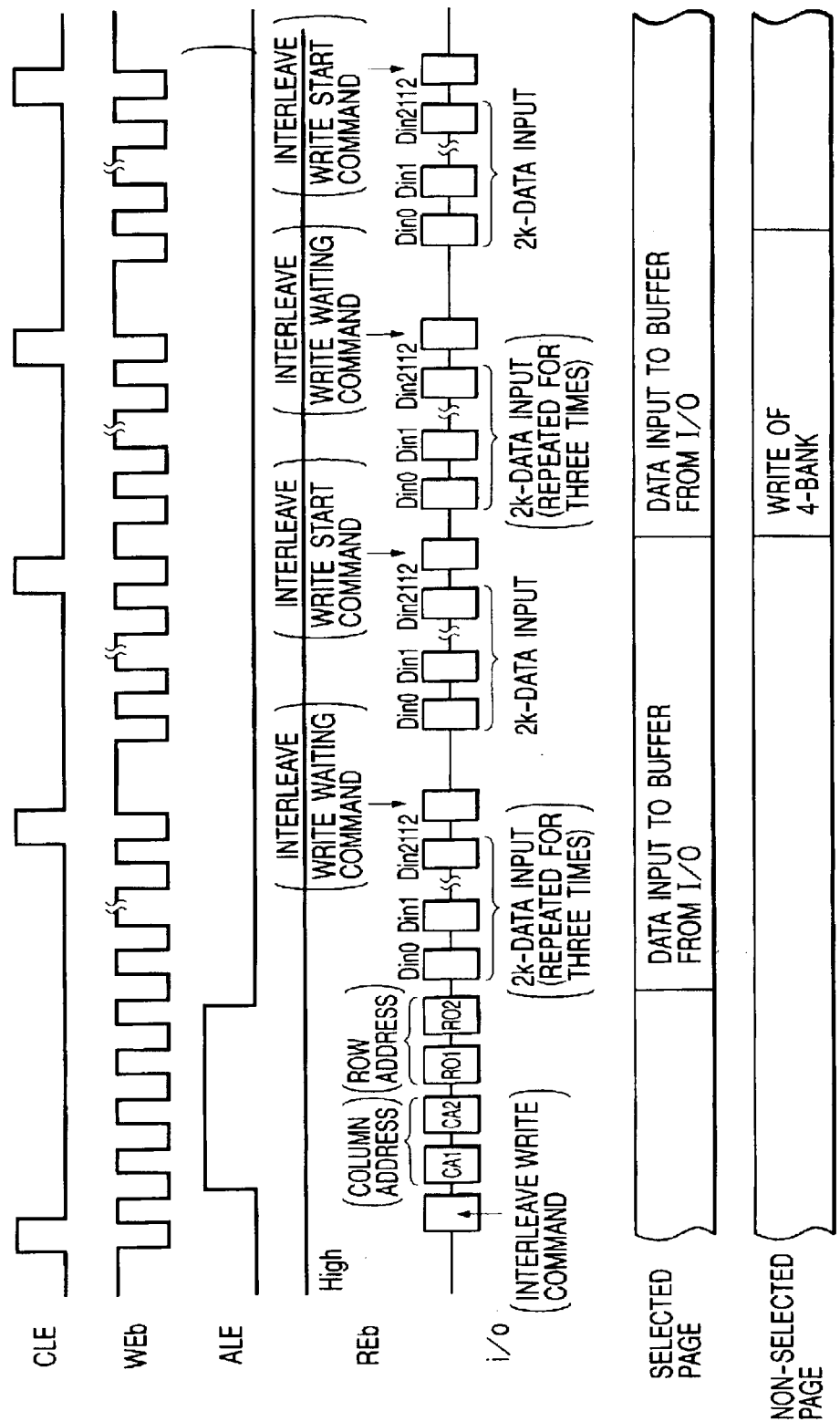
FIG. 7 is a timing chart of the interleave write operation of FIG. 5.

FIG. 7 illustrates the timing chart of the 4-bank parallel interleave write operation. A column address and a raw address are inputted following the interleave write command code. Thereafter, the write data and write wait command of the memory bank BNK0, the write data of write wait command of the memory bank BNK1, the write data and write wait command of the memory bank BNK2 and the write data and write start command of the memory bank BNK3 are sequentially inputted. The write data sequentially inputted from the external side are stored to any one of the buffer memories BMRY0(L) to BMRY3(L) of even pages or buffer memories BMRY0(R) to BMRY3(R) of odd pages. Upon reception of the write start command, the write data stored in any one buffer memory BMRY in the memory banks BNK0 to BNK3 is written to the 4-bank flash memory arrays FARY0 to FARY3 corresponding in parallel. In parallel to the write operation to the flash memory arrays FARY0 to FARY3, the write data of the next page address are sequentially stored in serial, as described above, to the other buffer memory of the buffer memories BMRY0(L) to BMRY3(L) of even pages or the buffer memories BMRY0(R) to BMRY3(R) of odd pages. In the same manner, the operation to store the write data to the buffer memory from the external side and the operation to write the write data stored in the buffer memory to the flash memory array are performed in parallel. Although not particularly restricted, this interleave operation is continued until the chip is no longer selected with the control signal CEb.

Figure 8:
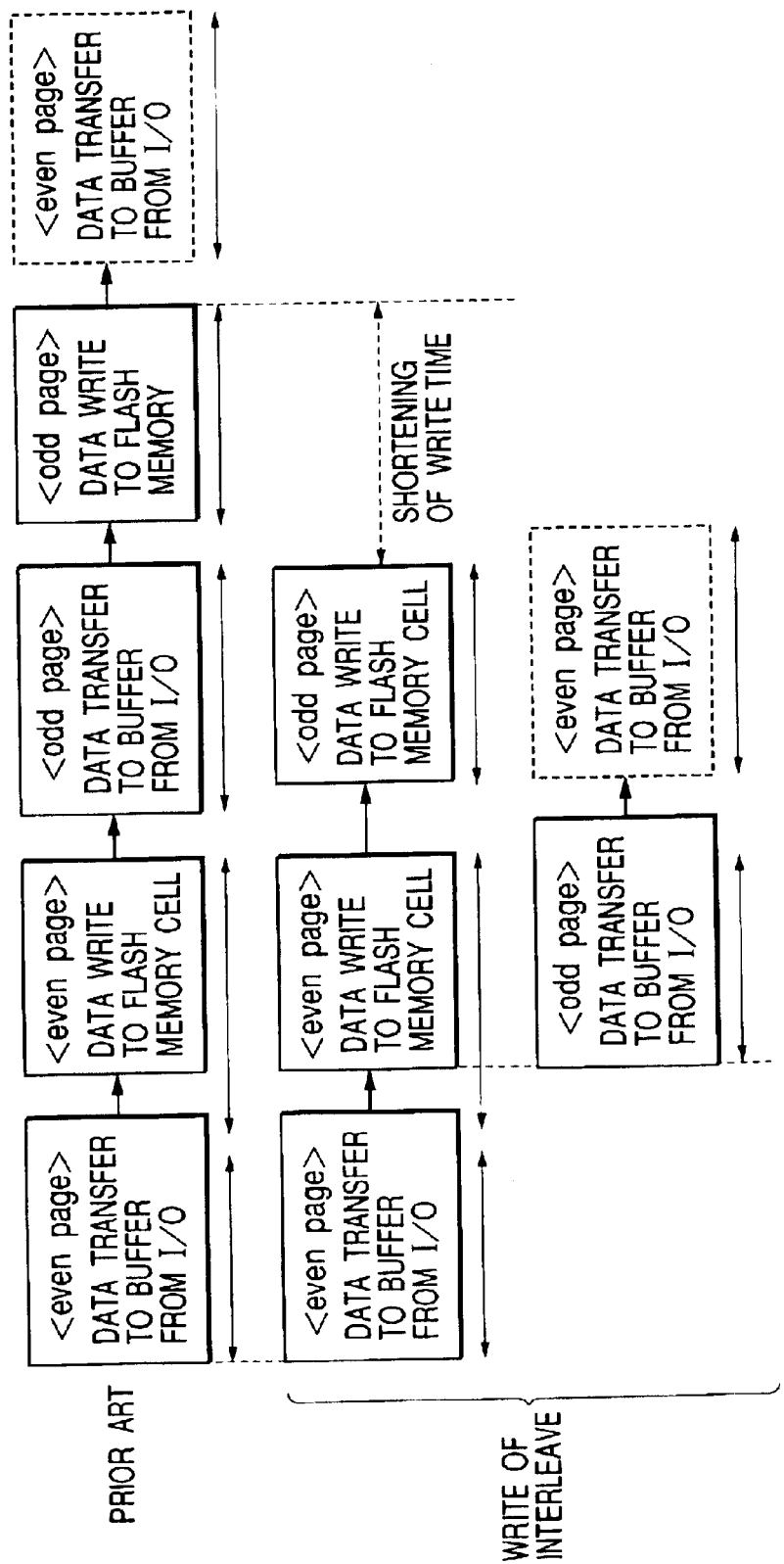
FIG. 8 illustrates comparison between the interleave write operation of FIG. 5 and the interleave write operation of the prior art.

FIG. 8 illustrates an example of comparison between the 4-bank parallel interleave write operation of flash memory 1 and the write operation in the prior art. The time required for write operation can be shortened in comparison with that of the prior art by performing in parallel the operation to store the write data to the buffer memory from the external side and the operation to write the write data stored in the buffer memory to the flash memory array.

<<Buffer Memory Size Equal to Access Unit>>

Next, the interleave operation in the structure where the buffer memory size of memory bank is equal to the access unit will be described. In short, the storage capacity of respective buffer memories BMRY0 to MBRY3 is set to a half of the capacity in the case described above.

In this case, in the flash memory 1 of FIG. 15, the buffer memories BMRY0 to BMRY3 for each memory bank have the storage capacity equal to the write unit and read unit in the respective corresponding flash memory arrays. For example, when this storage capacity is applied to the flash memory 1, since the write information unit and read information unit is defined as one page (=2K bytes), the respective buffer memories BMRY0 to BMRY3 as the on-chip buffer have the storage capacity of 2K bytes. In other words, respective buffer memories BMRYi(L) and BMRYi(R) divided to the right and left sides have the storage capacity of 1K bytes.

FIG. 17 schematically illustrate connections among the flash memory arrays FARY0 to FARY3, buffer memories BMRY0(L), BMRY0(R) to BMRY3(L), BMRY3(R), and input/output terminals i/o0 to i/o7. In the read operation for the flash memory 1, the buffer memory BMRYi for temporarily storing the stored information of the flash memory array FARYi selected based on the page address information is interfaced with the external input/output terminals i/o0 to i/o7. The left side buffer memory array BMRYi(L) stores the data of the column address of even number in the selected page, while the right side buffer memory BMRYi(R) store the data of column address of odd number in the selected page. Moreover, in the write operation for the flash memory 1, as the write data to be given to the external input/output terminal, the data of column address of even number is temporarily stored to the left side buffer memory BMRYi(L) of one buffer memory BMRYi selected based on the page address information or the like, while the data of column address of odd number is temporarily stored to the right side buffer memory BMRYi(R).

FIG. 18 illustrates an example of mapping of page address to the memory bank for interleave access in the case where one buffer memory of 4-bank having the storage capacity equal to the access unit (write and read unit) is provided for each bank. As illustrated in the figure, the continuous page addresses are not mapped in the same memory bank. The page address is mapped in every other 4 pages.

FIG. 19 illustrates an example of interleave read operation profile in the page address mapping of FIG. 18. In the operation ①, the storage information is read from the flash memory arrays FARY0, FARY1 and the storage information read out is then transferred to the buffer memory BMRY0 and BMRY1. In the operation ②, the read data transferred previously to the buffer memories BMRY0, BMRY1 is outputted to the external side, the storage information is read in parallel to such output from the flash memory arrays FARY2, FARY3 and then such storage information read out is then transferred to the buffer memories BMRY2, BMRY3. With parallel operations in the operation ②, high speed read operation can be realized. The external output from i/o terminal is performed in serial in the sequence of the buffer memories BMRY0 and BMRY1.

Figure 20:
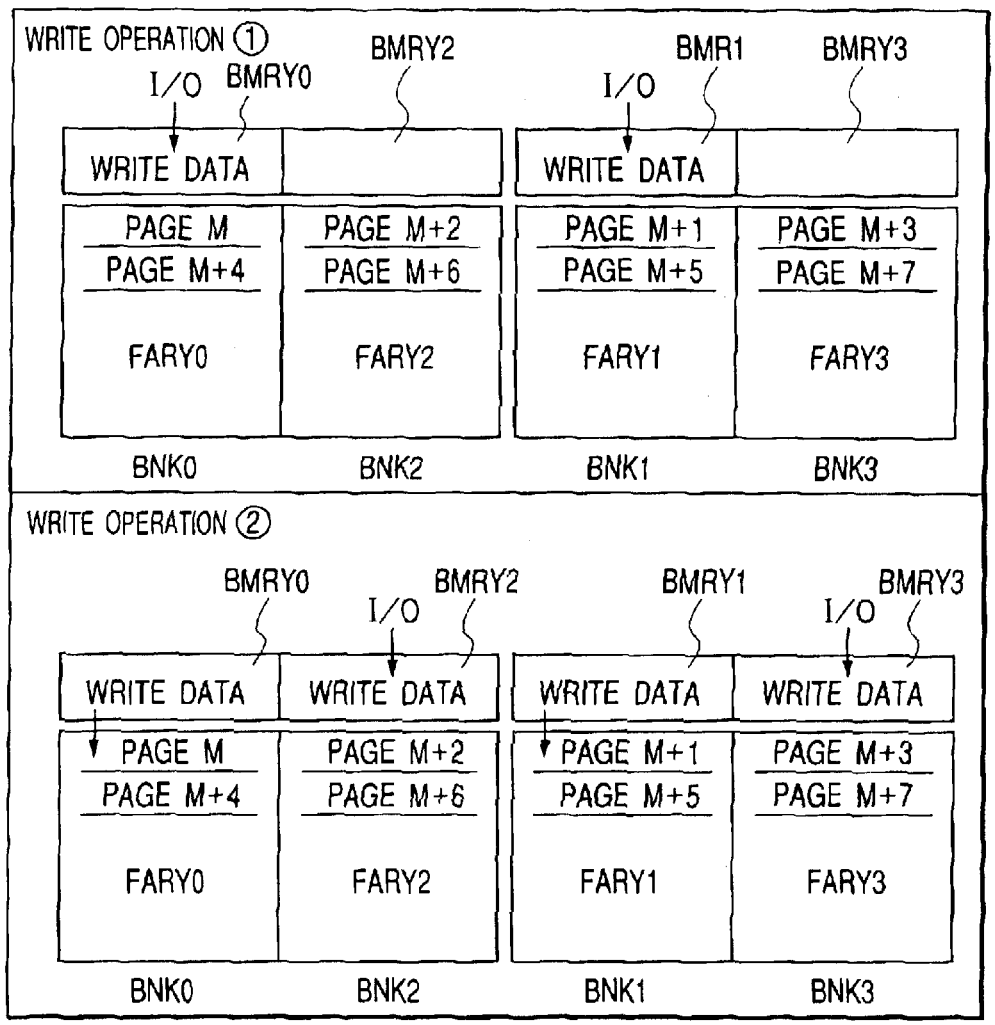
FIG. 20 illustrates an example of the interleave write operation profile in the page address mapping of FIG. 18.

FIG. 20 illustrates an example of interleave write operation profile in the page address mapping of FIG. 18. In the operation ①, the write data from the external side is inputted to the buffer memories BMRY0, BMRY1. Input from the i/o terminal is conducted serially in the sequence of the buffer memories BMRY0, BMRY1. In the operation ②, the write data transferred previously to the buffer memories BMRY0, BMRY1 is written to the flash memory arrays FARY0, FARY1. In parallel to this write operation, the next write data is inputted to the buffer memories BMRY2, BMRY3 from the external side. The high speed write operation can be realized with the parallel processes in the operation ②.

Figure 21:
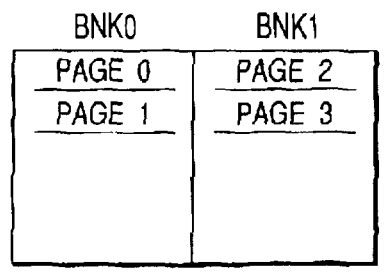
FIG. 21 illustrates an example of mapping of page address for the memory bank for interleave access in the memory arrays structure having a buffer memory equal to the access unit for every memory bank in the unit of two memory banks.

FIG. 21 illustrates an example of page address mapping to the memory bank for the interleave access when a buffer memory of the storage capacity equal to the access unit (the write and read unit) for each memory bank in unit of two memory banks is provided. As illustrated in the example of the same figure, the continuous page address is mapped for the same memory bank. When application to FIG. 15 is considered, the memory banks BNK0 and BNK1 are defined as a unit and the memory banks BNK2 and BNK3 are also defined as the other unit and the access operation is performed in the same manner in each unit. Attention is paid only to one unit to easier understanding and the structure and operation in this unit will then be described.

Figure 22:
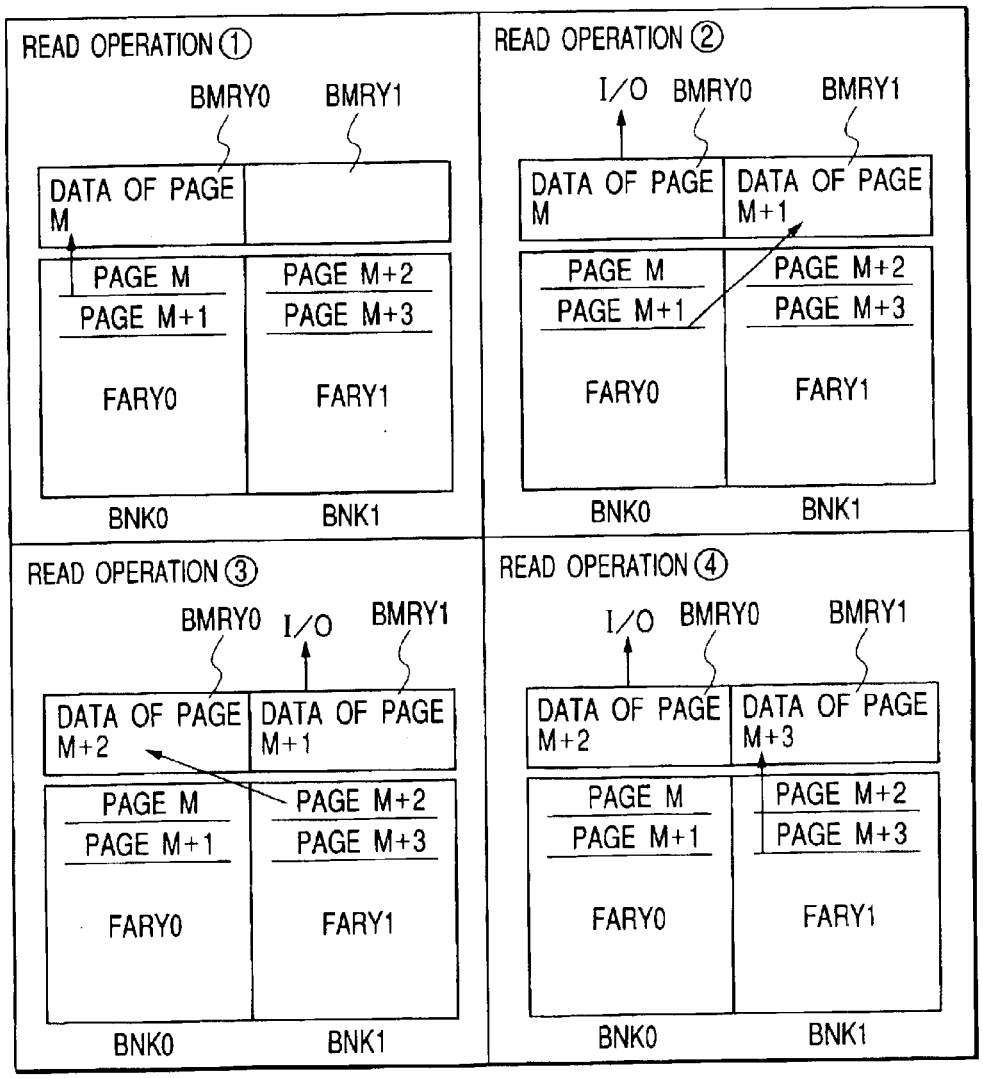
FIG. 22 illustrates an example of the interleave read operation profile in the page address mapping of FIG. 21.

FIG. 22 illustrates an example of the interleave read operation profile in the page address mapping of FIG. 21. In the operation ①, the storage information is read from the flash memory array FARY0 and the storage information read out is then transferred to the buffer memory BMRY0 of the same memory bank BNK0. In the operation ②, the read data transferred previously to the buffer memory BMRY0 is then outputted to the external side, the storage information of the next page address is then read from the flash memory array FARY0 in parallel with this output process and the storage information read out is then transferred to the buffer memory BMRY1 of the neighboring memory bank BNK1. In the operation ③, the read data previously transferred to the buffer memory BMRY1 is then outputted to the external side, the storage information of the next page address is then read in parallel to such output process from the flash memory array FARY1 and the storage information read out is then transferred to the buffer memory BMRY0 of the neighboring memory bank BNK0. In the operation ④, the read data transferred previously to the buffer memory BMRY0 is outputted to the external side, the storage information of the next page address is then read in parallel to such output process from the flash memory array FARY1, and the storage information read out is then transferred to the buffer memory BMRY1 of the same memory bank BNK1. The following processes are repeated as required. With parallel processes of the operations ②,③,④, high speed read operation can be realized. Although not particularly restricted, when the structures of two units of FIG. 21 are provided in parallel considering application to FIG. 15, it is enough when an external output from the i/o terminal is performed serially in the sequence of younger page addresses.

Figure 23:
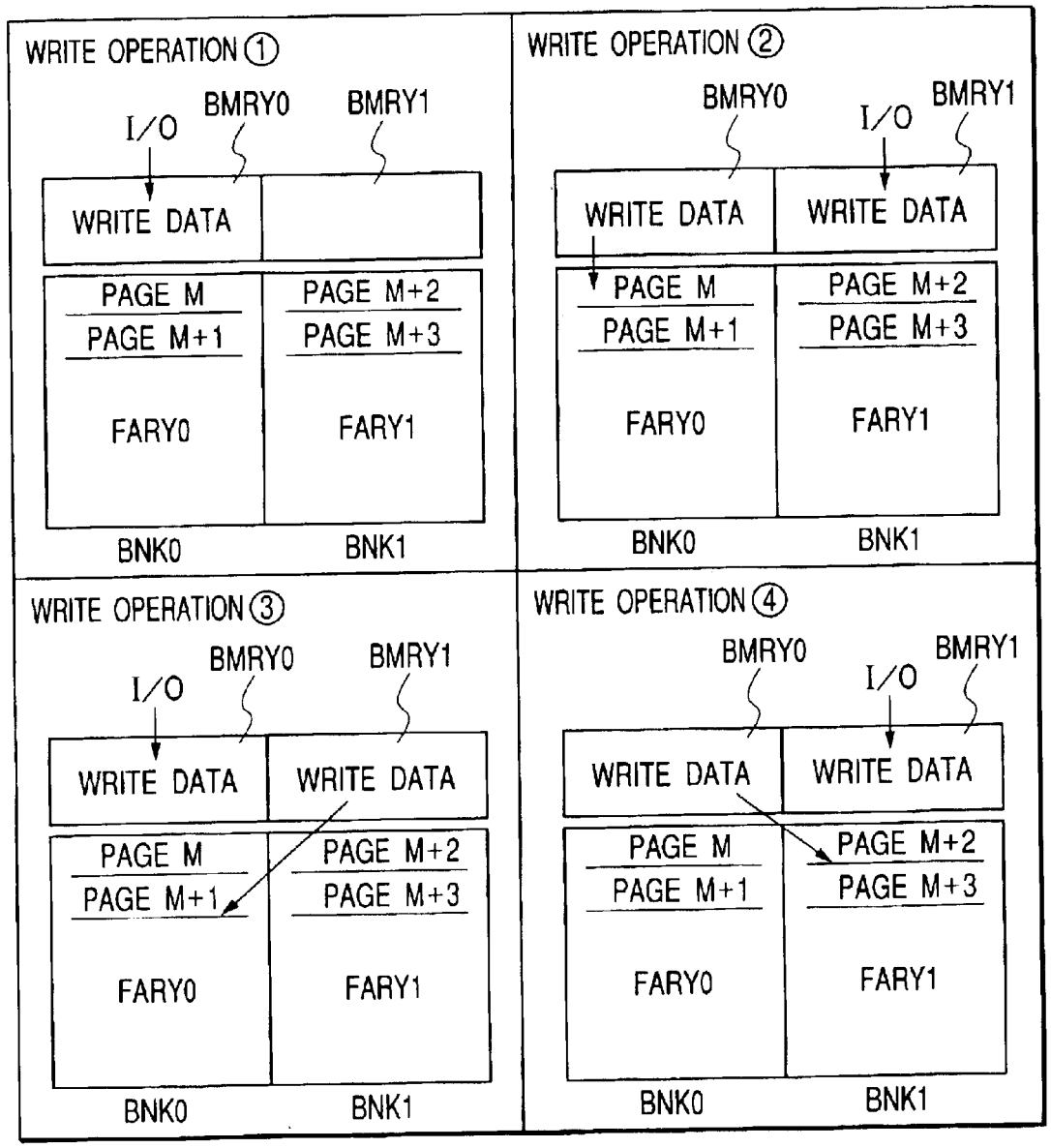
FIG. 23 illustrates an example of the interleave write operation profile in the page address mapping of FIG. 21.

FIG. 23 illustrates an example of the interleave write operation profile in the page address mapping of FIG. 21. In the operation ①, the write data is inputted from the external side to the buffer memory BMRY0. In the operation ②, the write data previously transferred to the buffer memory BMRY0 is then written to the flash memory array FARY0. The next write data is then inputted, in parallel to such write process, to the buffer memory BMRY1 from the external side. In the operation ③, the write data previously transferred to the buffer memory BMRY1 is then written to the flash memory array FARY0 of the neighboring memory bank and the next write data is then inputted, in parallel to this write operation, to the buffer memory BMRY0 from the external side. In the operation ④, the write data previously transferred to the buffer memory BMRY0 is then written to the flash memory array FARY1 of the neighboring memory bank. In parallel to this write operation, the next write data is inputted to the buffer memory BMRY1 from the external side. The similar processes are repeated as required. With parallel processes of the operations ②, ③, ④, high speed write operation can be realized. Although not particularly restricted, when the structure for two units of FIG. 21 are provided in parallel considering application to FIG. 15, it is enough when an external input from the i/o terminal is processed serially in the sequence of the younger page address.

The present invention has been described practically on the basis of the preferred embodiment thereof but the present invention is never limited thereto and allows various changes or modifications within the scope of the claims thereof.

For example, the buffer memory introduces a serial transfer system in which data in unit of page is serially transferred using the SRAM for access in unit of byte, but a data latch circuit of parallel transfer system may be used for the flash memory array to realize internal transfer of the data in unit of page.

The size of buffer memory may be n pages or more (n: natural number larger than 1) for every bank.

The present invention may be applied not only to multi-level flash memory such as 4-level memory but also to 2-level flash memory. In addition, storing system of the multi-level flash memory is not limited only to the structure to sequentially change threshold voltages depending on the value of storage information and is capable of employing a memory cell structure which utilizes charge trap film (silicon nitride film) for information storage of multi-level by locally changing the area to store charges in the memory cells. Moreover, it is also possible to employ the other storing system such as higher dielectric material memory cell as the nonvolatile memory cell.

Moreover, the present invention may introduce not only the structure where both address/data are multiplexed and then inputted to the I/O terminal but also the structure where the address terminal is provided to input addresses. It is also possible to use a command to designate any access to the buffer memory or to the flash memory array depending on the address inputted from the address terminal. In this case, destination of access may be determined with a control signal to designated the access to the buffer memory or flash memory. Even in this case, further, access to the buffer memory may be made in unit of the page from the flash memory and access to the buffer memory may also be made in unit of byte.

Effects of the typical inventions of the present invention disclosed in this specification are as follows.

Namely, high speed write and read access to nonvolatile memory section can be realized.

Overhead of data transfer between external side and nonvolatile memory section can be lowered.

What is claimed is:

1. A nonvolatile memory comprising:

a plurality of memory banks; and a control circuit, wherein each of said memory banks comprises a non-volatile memory unit and two buffer memories, wherein said nonvolatile memory unit is capable of storing data, wherein said two buffer memories are capable of storing a first length data which length is storable data length to said nonvolatile memory unit at once, and wherein said control circuit controls, in response to instructing an access operation, a first transferring between said nonvolatile memory unit and a first buffer memory of said buffer memories and, in parallel to said first transferring, controls a second transferring between a second buffer memory of said buffer memories and outside of nonvolatile memory.

2. A nonvolatile memory according to claim 1, wherein said nonvolatile memory unit has a plurality of memory cells and a plurality of word lines, wherein each of said word lines couples to corresponding ones of said memory cells, and wherein said control circuit controls a read operation or a program operation as objecting one part of said memory cells coupled to one word line at a first timing, and controls said access operation as objecting other part of said memory cells coupled to said one word line at other timing.

3. A nonvolatile memory according to claim 2,
wherein in response to instructing of said read operation, said control circuit controls said first transferring data read from said ones of memory cells coupled to said one word line to said first buffer memory and, in parallel to said first transferring, controls said second transferring data from said second buffer memory to outside of nonvolatile memory.

4. A nonvolatile memory according to claim 2,
wherein in response to instructing of said program operation, said control circuit controls said first transferring data from said first buffer memory to said ones of memory cells coupled to said one word line for programming and, in parallel to said first transferring, controls said second transferring data from outside of nonvolatile memory to said second buffer memory.

5. A nonvolatile memory comprising:
a plurality of memory banks; and
a control circuit,
wherein each of said memory banks comprises a nonvolatile memory unit which is capable of storing data, and a buffer memory which is capable of storing data which data length is storable data length to said nonvolatile memory unit at once,
wherein said control circuit controls, in response to instructing an access operation, a first transferring between said nonvolatile memory unit comprised in one memory bank and said buffer memory comprised in said one memory bank and, in parallel to said first transferring, controls a second transferring between said buffer memory comprised in other memory bank and outside of nonvolatile memory at a first timing, and
a third transferring between said nonvolatile memory unit comprised in one memory bank and said buffer memory comprised in said other memory bank and, in parallel to said third transferring, controls a forth transferring between said buffer memory comprised in said one memory bank and outside of nonvolatile memory at a second timing.

6. A nonvolatile memory according to claim 5,
wherein in an address arrangement of said nonvolatile memory, a first address, a second address and a third address are continuously and are incapable of accessing at one access operation each other, and
wherein said first address and said second address are assigned to said nonvolatile memory unit of said one memory bank and said third address is assigned to said nonvolatile memory unit of said other memory bank.

7. A nonvolatile memory comprising:
a plurality of memory banks; and
a control circuit,
wherein each of said memory banks comprises a nonvolatile memory unit and a buffer memory,
wherein said control circuit controls, in response to instructing an access operation, a first transferring between said nonvolatile memory unit comprised in one memory bank and said buffer memory comprised in said one memory bank and, in parallel to said first transferring, controls a second transferring between said buffer memory comprised in other memory bank and outside of nonvolatile memory at a first timing.

8. A nonvolatile memory according to claim 7,
wherein in an address arrangement of said nonvolatile memory, a first address and a second address are continuously and are incapable of accessing at one access operation each other, and
wherein said first address is assigned to said nonvolatile memory unit comprised in first memory bank which is different from nonvolatile memory unit comprised in memory banks said second address assigned to.

9. A nonvolatile memory according to claim 7,
wherein said nonvolatile memory unit has a plurality of memory cells and a plurality of word lines,
wherein each of said word lines couples to corresponding ones of said memory cells, and
wherein said control circuit controls a read operation or a program operation as objecting one part of said memory cells coupled to one word line at a first timing, and controls said access operation as objecting other part of said memory cells coupled to said one word line at other timing.

10. A nonvolatile memory according to claim 7,
wherein said nonvolatile memory units are structured by a flash memory.

* * * * *